(12) United States Patent
Tsunoda et al.

(10) Patent No.: US 6,282,688 B1
(45) Date of Patent: *Aug. 28, 2001

(54) RECORDING APPARATUS

(75) Inventors: Motoyasu Tsunoda, Fujisawa; Syoichi Miyazawa, Yokohama; Soichi Isono, Chigasaki; Akira Kojima, Odawara; Noriyuki Karasawa, Yokohama; Fukashi Ohi, Odawara; Takashi Oeda, Yokohama, all of (JP)

(73) Assignee: Hitachi, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/825,128

(22) Filed: Mar. 27, 1997

Related U.S. Application Data

(62) Division of application No. 07/948,256, filed on Sep. 21, 1992, now Pat. No. 5,638,386.

(30) Foreign Application Priority Data

Sep. 20, 1991 (JP) .................................... 3-241826
Feb. 18, 1992 (JP) .................................... 4-030638

(51) Int. Cl.$^7$ .................................... G11B 20/18
(52) U.S. Cl. ............................................ 714/769
(58) Field of Search .................... 371/40.14; 714/769

(56) References Cited

U.S. PATENT DOCUMENTS

| 4,584,686 | * | 4/1986 | Fritze | 371/37 |
| 4,697,281 | * | 9/1987 | O'Sullivan | 379/59 |
| 4,890,287 | * | 12/1989 | Johnson et al. | 371/37.2 |
| 5,315,600 | * | 5/1994 | Iwamura et al. | 371/37.6 |
| 5,684,791 | * | 11/1997 | Raychaudhuri et al. | 370/278 |
| 5,715,243 | * | 2/1998 | May | 370/312 |
| 5,717,689 | * | 2/1998 | Ayanoglu | 370/349 |
| 5,719,875 | * | 2/1998 | Wei | 371/2.1 |
| 5,796,727 | * | 8/1998 | Harrison et al. | 370/338 |
| 5,896,382 | * | 4/1999 | Davis et al. | 370/401 |
| 5,968,200 | * | 10/1999 | Amrany | 714/786 |

* cited by examiner

Primary Examiner—Stephen M. Baker
(74) Attorney, Agent, or Firm—Antonelli, Terry, Stout & Kraus, LLP

(57) ABSTRACT

A recording apparatus includes a plurality of ECC units operating selectively and independently. A medium access unit reads data from a recording medium in a read mode, and writes data from a host device to the recording medium in a write mode. The data read out from the recording medium contains a reproduction data and a medium reproduction check symbol added to the reproduction data, and data written contains a recording data and a medium recording check symbol added to the recording data. The reproduction data or the recording data is stored in a buffer. In a read mode, the reproduction data from the medium access unit is transferred to the host device through the buffer and in the write mode, the recording data from the host device is transferred to the medium access unit through the buffer. Each ECC units detects any error of the data stored based on the check symbol added to the data stored in the buffer during the transfer operation, corrects the data stored when the error is detected, and generates a check symbol from the data transferred. The check symbol generated is transferred to a destination of transfer after the data to be transferred.

2 Claims, 17 Drawing Sheets

F I G. 4
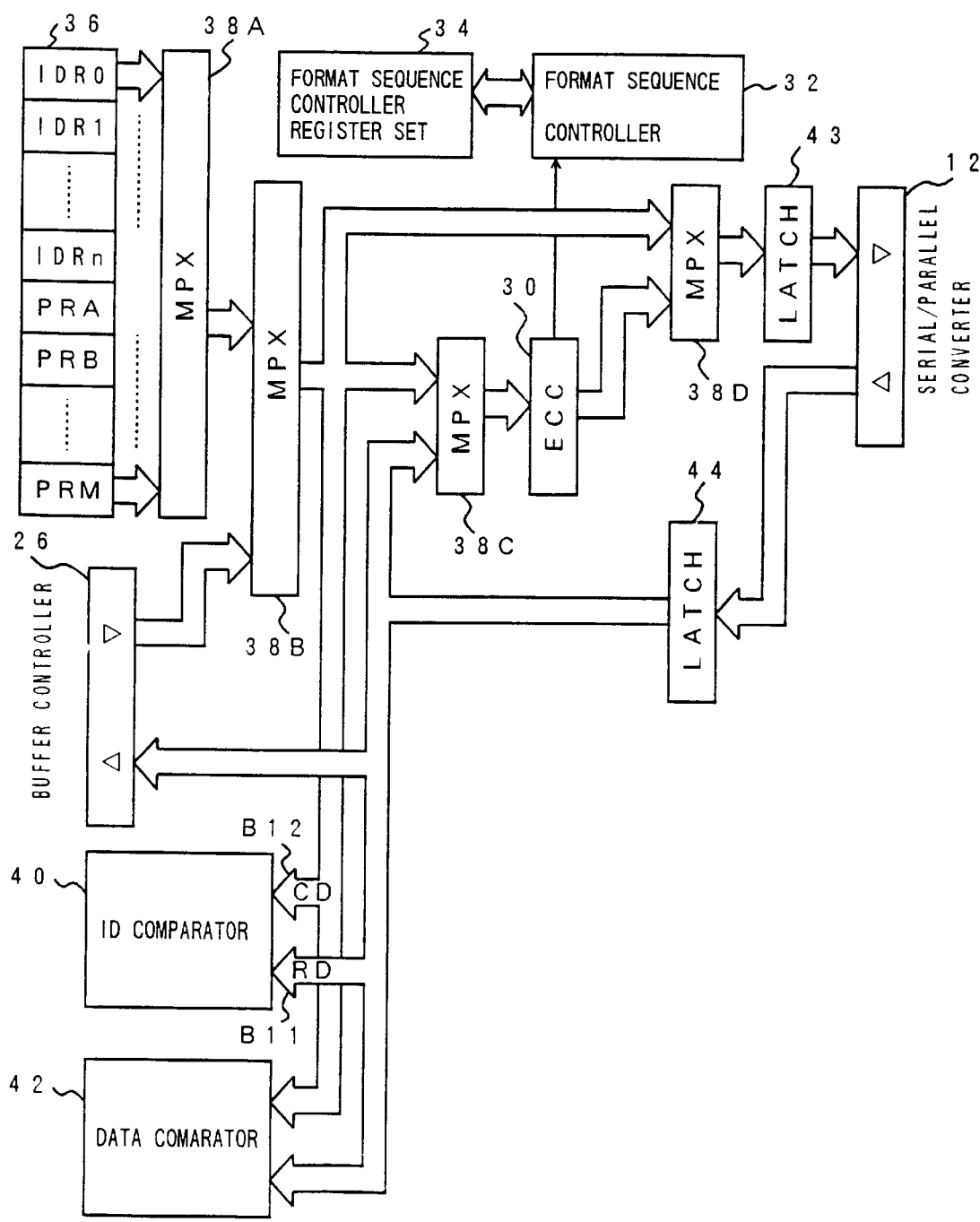

FIG. 10

| ID | | | | CRC |
|---|---|---|---|---|
| 1ST BYTE | 2ND BYTE | | 3RD BYTE | |
| CYLINDER ADDRESS (10BITS) | HEAD ADDRESS (4BITS) | SECTOR ADDRESS (6BITS) | FLAG (4BITS) | |

FIG. 11

| IDL1 | | IDL0 | | |
|---|---|---|---|---|
| CYLINDER ADDRESS LENGTH (4BITS) | HEAD ADDRESS LENGTH (3BITS) | SECTOR ADDRESS LENGTH (3BITS) | FLAG LENGTH (3BITS) | UNUSED |
| 1 0 1 0 | 1 0 0 | 1 1 0 | 1 0 0 | 0 0 0 |
| 10 | 4 | 6 | 4 | |

SET VALUE →

FIG. 14A  OUTPUT DATA FROM DATA BUFFER  
FIG. 14B  INPUT Ia TO ECC-A
INPUT Ib TO ECC-B  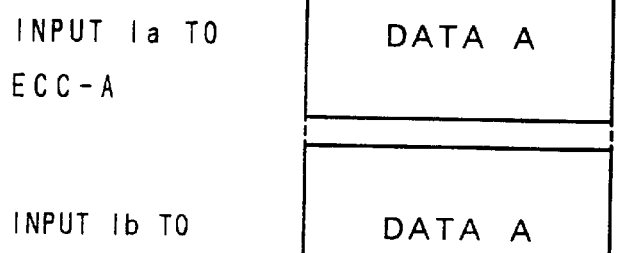
FIG. 14C  INPUT Ia TO ECC-A
INPUT Ib TO ECC-B  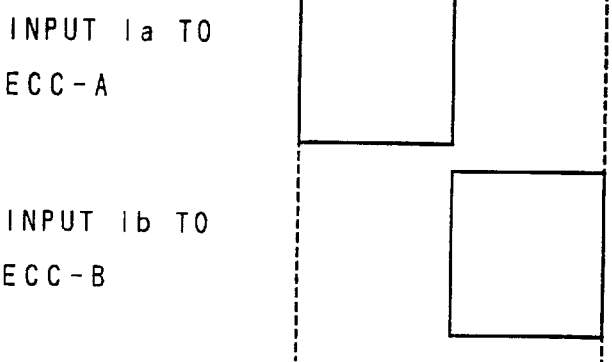
FIG. 14D  INPUT Ia TO ECC-A
INPUT Ib TO ECC-B  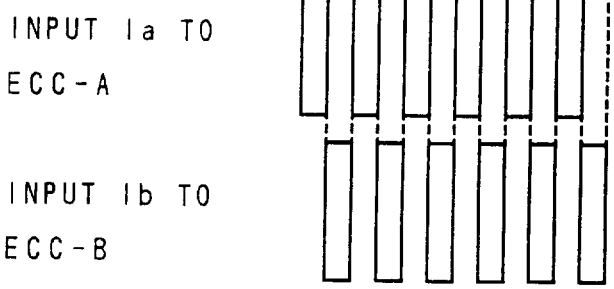

E.D.P. : ERROR DETECTION PROCESSING
E.C.P. : ERROR CORRECTION PROCESSING
A.C. : AFTER CORRECTION

RECORDING APPARATUS

This is a divisional of application Ser. No. 07/948,256, filed Sep. 21, 1992, now U.S. Pat. No. 5,638,386.

BACKGROUND OF THE INVENTION

1. Field of the Invention

This invention relates to a recording apparatus capable of varying the length of identification (ID) data of recording data in a bit unit and/or improving reliability of data transfer between a host computer and a recording medium by use of an error detection/error correction function.

2. Description of the Related Art

Technique relating to conventional recording apparatuses such as a magnetic disk control apparatus is described, for example, in the instruction manual of "HD64950S" (a hard disk controller of Hitachi, Ltd.). Thereby, identification (ID) data is generated at the time of disk formatting and contains cylinder address data, head address data, sector address data and flag data. The length of each data is set and fixed in a byte unit. At the time of search for a sector, ID data of an object sector and read ID data are compared with each other, and whether or not the sector corresponding to the read ID data is the object sector is judged on the basis of coincidence or non-coincidence of the ID data as a whole.

However, the prior art technique described above does not much take into consideration the reduction of a storage region for storing the ID data which reduction is required with a greater capacity and higher performance of a magnetic disk apparatus, or in other words, optimization in accordance with a necessary data quantity, and diversification of ID data searching functions.

The conventional recording apparatus is equipped with a error detecting and error correcting function for data transfer between a recording medium and a data buffer but does not have such a function for data transfer between a host computer and the data buffer. For this reason, even when erroneous data is transferred from the host computer to the data buffer, the error cannot be detected and corrected, so that reliability of the entire system inclusive of the disk apparatus tends to remarkably drop.

Furthermore, a check symbol added to data to be recorded is only one kind. Therefore, when any-error occurs in the check symbol itself or when the check symbol becomes non-reproducible, the data is likely to be judged as wrong or the error correction cannot be made correctly even though the data itself does not contain any error.

Data is recorded dividedly in each sector as a recording unit, and reproduction of the data is made in this sector unit. In this case, no problem occurs if the data of only one sector is reproduced but when a plurality of sectors are reproduced continuously, the following problem occurs. The data reproduced from a recording medium become sequentially the object of error detection processing in an error detection/correction circuit (ECC) and the error correction processing is executed if any error exists. When the error is detected in the data reproduced from any of the sectors other than the last sector, the data from a next sector is reproduced while the error correcting processing is being made for this sector data, so that the error detection processing cannot be made for the next sector data. For this reason, conventionally, after one rotation of the disk is waited for, the next sector data is reproduced and is subjected to the error detection processing. According to this method, however, the data read-out operation is retarded by the time corresponding to one rotation of the disk, so that data transfer performance is deteriorated drastically.

SUMMARY OF THE INVENTION

It is therefore an object of the present invention to provide a disk apparatus capable of varying a memory region of an identification (ID) data.

It is another object of the present invention to provide a disk apparatus capable of improving reliability of data not only for data transfer between a recording medium and a data buffer but also for data transfer between a host computer and the data buffer.

It is still another object of the present invention to provide a disk apparatus capable of improving reliability for an inspection symbol.

It is still another object of the present invention to provide a disk apparatus capable of preventing the drop of transfer performance occurring due to the error of a data during a read operation of a plurality of continuous sectors.

To accomplish the objects described above, a magnetic disk control apparatus for judging whether a given sector is a requested sector, from the ID data read out from a disk includes a first setting unit for variably setting the length of a memory region of the ID data in a bit or byte unit, an output unit for outputting the ID data in a set length to the disk, an input unit for inputting the read ID data, and a comparison unit for comparing ID data having variable lengths.

In a disk control apparatus for judging-whether or not a given sector is a requested data from the ID data read out from a disk, a memory region of each of the cylinder address data, head address data, sector address data and flag data is set by a first setting unit in a bit or byte unit in an optimum length for ID data of the disk apparatus. The ID data is outputted in a set length by an output unit. At the time of data input/output, an input unit inputs the ID data read out from the disk, and a comparison unit compares the ID data having a variable length.

To accomplish another object of the invention described above, the present invention includes a first error detection/correction (ECC) unit of data for generating check symbols for data in order to detect and record an error of the data during data transfer between a host computer and a data buffer, and a second ECC unit for generating check symbols for data to be recorded and for detecting an error of reproduced data during data transfer between a recording medium and the data buffer.

To accomplish still another object of the invention described above, the present invention includes a transfer unit for writing data from a host computer into a data buffer and reading the data from the data buffer and transferring it to the host computer, a read unit for reading the data from the data buffer for the purpose of recording, first and second ECC units for generating first and second check symbols for the data, from the data read out from the data buffer, a generation unit for adding the first and second check symbols to the data read out from the data buffer and using them as recording data on a recording medium, a write unit for writing only data, among the reproduced data having the first and second check symbols added thereto and reproduced from the recording medium, into the data buffer, a third ECC unit for detecting an error of the data from the data among the reproduction data and from the first check symbols, and a fourth ECC unit for detecting an error of the data from the data among the reproduced data and from the first check symbol.

Furthermore, the present invention includes a write unit for writing only the data, among the sector data obtained by adding a check symbol to the data and reproduced from a recording medium in a sector unit, into a data buffer, first and second ECC units for detecting and correcting an error of the sector data, and a transfer unit for alternately allotting and transferring alternately the data to the first and second ECC units for each sector data.

Only the data among the data which is transferred from the host computer and has the check symbol is transferred to, and stored in, the data buffer, and is then transferred with the check symbol to the first ECC unit. The first ECC unit executes the error detection of the data from the check symbol-and when any error is detected, the data stored in the data buffer can be corrected. When the data written into this data buffer is transferred to the host computer, the first ECC unit generates the check symbol for the data and adds it to the data, and the data after the addition of the check symbol can be transferred to the host computer.

When the data is transferred from the data buffer to the recording medium, the check symbols for the data are separately generated by the first and second ECC units of at least two system which are equal to, or different from, one another, are added to the data and are then written into the recording medium. When the data is reproduced from the recording medium, the data is stored in the data buffer, the respective check symbols are transferred to the corresponding third and fourth ECC units with the data, and are subjected to the error correction in each of the third and fourth ECC units. In this case, the data is judged as containing the error only when the error is detected simultaneously by the third and fourth ECC units for the reproduced data, and the error is contained in the check symbols transferred to the third or fourth ECC unit detecting the error in other cases.

When a plurality of sector data are reproduced continuously, these data are alternately transferred to the first and second ECC units for each sector and the error detection is carried out. Accordingly, when-the error is detected in an intermediate sector data and the error correcting operation is carried out consecutively, the next sector data, even when it is reproduced, is transferred to one of the first and second ECC units which does not execute the error correcting operation. In this way, the error detecting operation can be carried out immediately for this sector data, and it is not necessary to wait for one more round of revolution of the disk to conduct data reproduction from the disk.

BRIEF DESCRIPTION OF THE DRAWINGS

FIG. 4 is a block diagram of a drive interface controller of the disk apparatus according to the present invention;

FIG. 10 is an explanatory view of a modified structure of the ID data in the disk apparatus according to the present invention;

FIG. 11 is an explanatory view of IDL in the ID data shown in FIG. 10;

FIGS. 14A to 14D are explanatory views showing a definite example of a method of generating check symbols;

DESCRIPTION OF THE PREFERRED EMBODIMENTS

Hereinafter, the present invention will be described about the case of a magnetic disk apparatus as an example of the recording apparatus with reference to the accompanying drawings.

Figure 1:
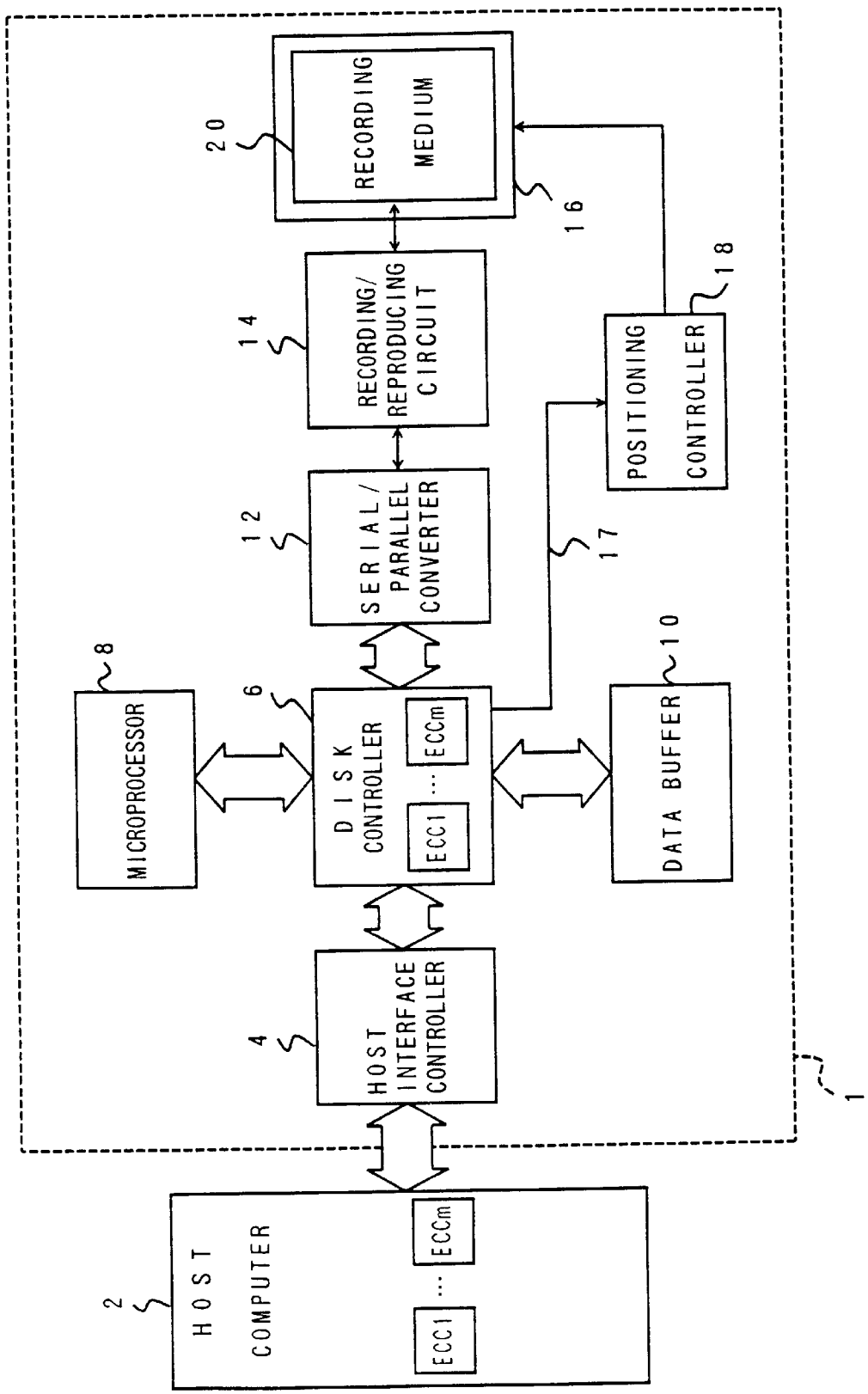
FIG. 1 is a block diagram of a disk apparatus according to the present invention and a computer system having this disk apparatus.

FIG. 1 shows a computer system utilizing the recording apparatus according to the present invention. This system includes a magnetic disk apparatus 1 and a central processing unit (host computer) 2. This apparatus 1 includes a host interface controller 4, a disk controller 6, a microprocessor 8, a data buffer 10, a serial/parallel convertor 12, a recording/reproducing circuit 14, a positioning controller 18 and a mechanism portion 16 (inclusive of a recording medium 20). A signal line 17 transmits a signal representing that non-coincidence occurs in the positioning controller of a magnetic head or in a magnetic head selection circuit.

A data transfer system of the disk apparatus 1 will be explained with reference to FIG. 1. The disk controller 6 operates under the control of the microprocessor 8. When the data is recorded on the recording medium 20, the data from the host computer is taken into the disk controller 6 through the interface controller 4 and is then stored in the data buffer 10. The data read out thereafter from the data buffer 10 by the controller 6 is converted to serial data by the serial/parallel convertor 12. After processing necessary for recording/reproduction is applied to the data by the recording/reproducing circuit 14, the data is applied to the recording medium 20. To reproduce the data from the recording medium, processing for reproduction is applied to the reproduced serial data by the recording/reproducing circuit 14, and the data is then converted to the parallel data by the convertor 12 and is once stored in the data buffer 10. This data is read out from the data buffer 10 by the disk controller 6 and is transferred to the host computer 2 through the controller 4.

Figure 2:
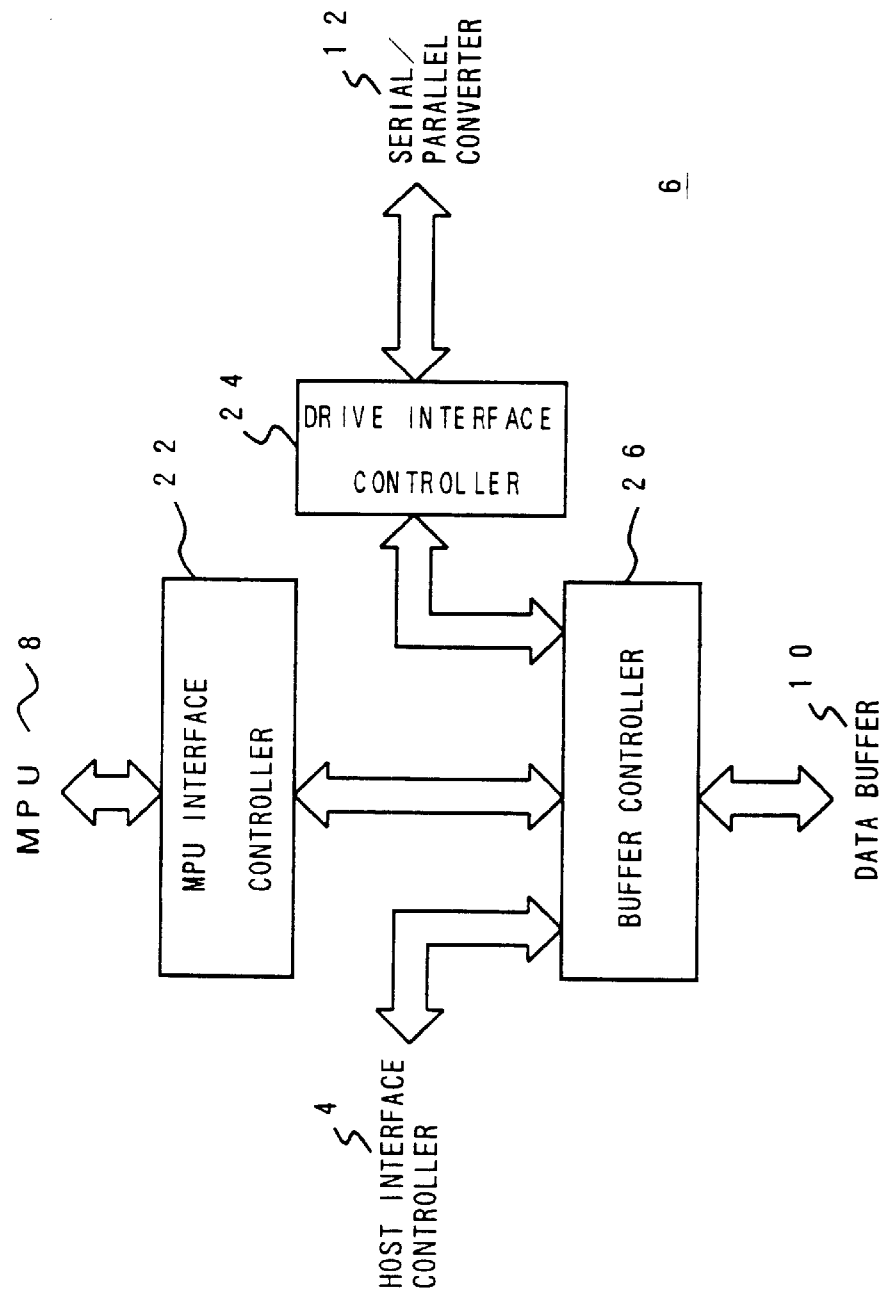
FIG. 2 is a block diagram of a disk apparatus according to the present invention.

FIG. 2 is an internal block diagram of the disk controller 6. The disk controller 6 includes an MPU interface controller 22, a buffer controller 26 and a drive interface controller 24.

Data paths and functions inside the disk controller 6 playing the primary role in the present invention will be explained with reference to FIG. 2. The MPU interface controller 22 controls the data transfer between the controller 6 and the microprocessor 17, and the buffer controller 26 controls the data transfer between the controller 6 and the data buffer 10. Further, the drive interface controller 24 controls the data transfer between the controller 6 and the serial/parallel convertor 12.

As described above, the disk controller 6 is provided with error detection and error correction functions so as to improve reliability of data transfer between the host computer 2 and the recording medium 20 as described, for example, in the instruction manual of "HD64950S" (a hard disk controller, produced by Hitachi, Ltd.).

Figure 3:
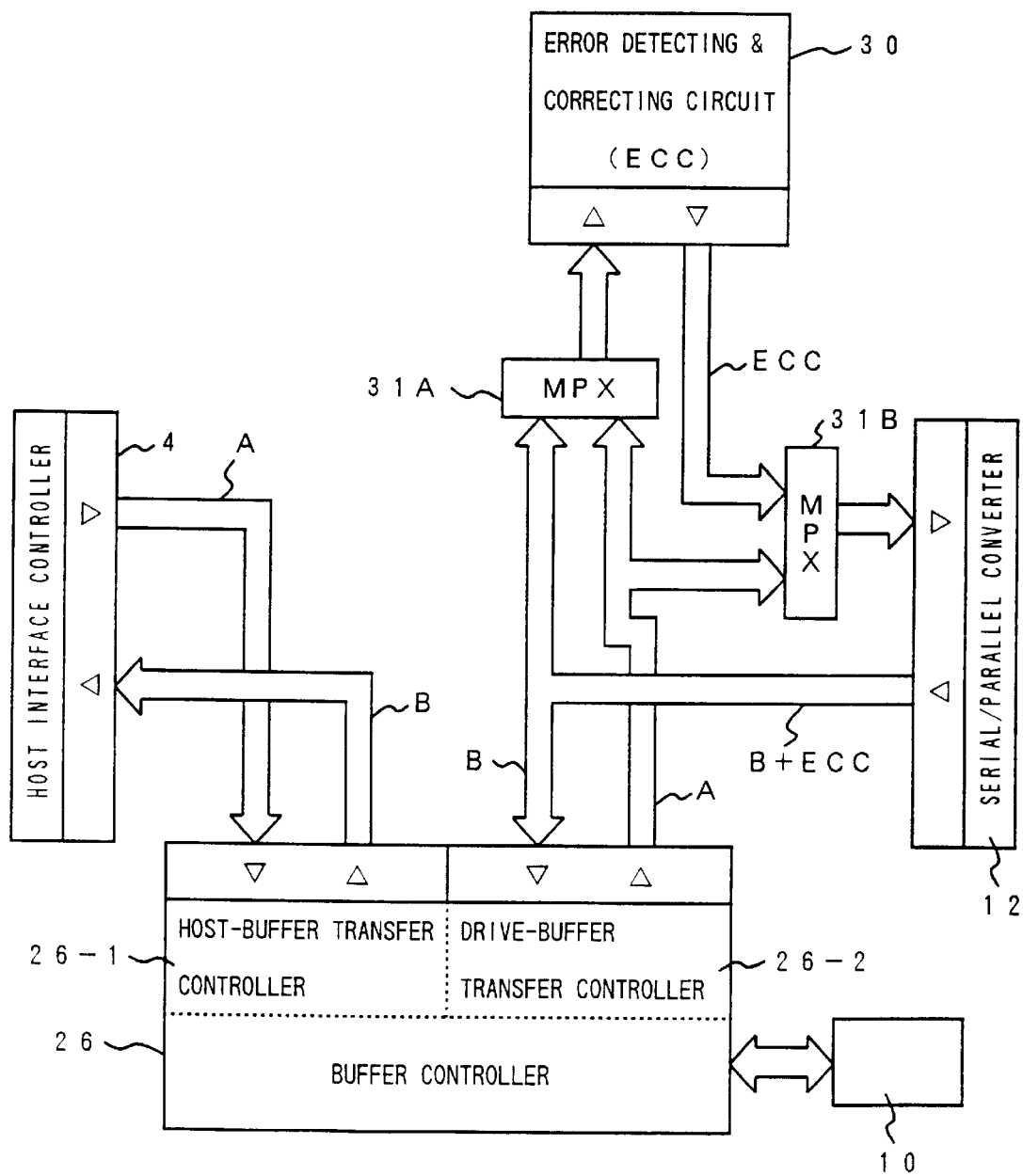
FIG. 3 is a block diagram showing an example of a disk controller.

FIG. 3 is a block diagram of the principal portions of the data transfer portion of such a disk controller 6. The drive interface controller 24 includes an error detecting/correcting circuit (ECC) 30 and multiplexers 31A and 31B. The buffer controller 26 includes a host-buffer transfer controller 26-1 for controlling the data transfer between the host interface controller 4 and the data buffer 10 and a drive-buffer controller 26-2 for controlling the data transfer between the convertor 12 and the data buffer 10. Each data transfer can be made simultaneously and independently.

Next, the data write operation from the host computer 2 to the recording medium 20 and the data read operation from the recording medium 20 to the host computer 2 will be explained.

(1) Data Write Operation:

Data A with a parity transferred from the host computer 2 through the host interface controller 4 is stored in the data buffer 10 by the transfer controller 26-1. The data A stored in the data buffer 10 is read out by the transfer controller 26-2, and is transferred to the convertor 12 through the MPX 31B and at the same time, to the ECC 30 through the MPX 31A, and check symbols (ECC) for the error detection/correction for this data A is generated. These check symbols (ECC) is transferred to the convertor 12 in succession to the data A through the MPX 31B, are processed by the recording/reproducing circuit 14, and are written into the recording medium 20.

(2) Data Read Operation:

The data B and the check symbol (ECC) corresponding thereto reproduced from the recording medium 20 are processed by the recording/reproducing circuit 14 and by the convertor 12, and are then transferred to the drive interface controller 24. This data B is stored in the data buffer 10 by the transfer controller 26-2 and, together with the check symbols (ECC), are transferred to the ECC 30, where the error detection of the data B is effected. When any error is detected, the error of the data B stored in the data buffer 10 is corrected. The data B in the data buffer 10 is read by the transfer controller 26-1, and is transferred to the host computer 2 through the host interface controller 4.

Next, the main functions of the drive interface controller 24 shown in FIG. 2 are listed-below.

(1) Disk format
(2) Detection of requested sector (ID retrieval)
(3) Write and read of requested data
(4) Generation of a error detection/correction code (a check symbol) for ID data and data, and write of them into disk
(5) Error detection/correction of ID data and data thus read.

To accomplish the functions described above, the controller 24 includes a format sequence controller 32, a register set 34 for the format sequence controller, a pattern register 36, MPXs 38 (38A, 38B, 38C, 38D), an ECC 30, an output latch 43, an input latch 44, an ID data comparator 40 and a DATA comparator 42, as shown in FIG. 4. A data bus B11 for transferring read data RD and a data bus B12 for transferring comparison object data are connected to these comparators 40 and 42.

Figure 5:
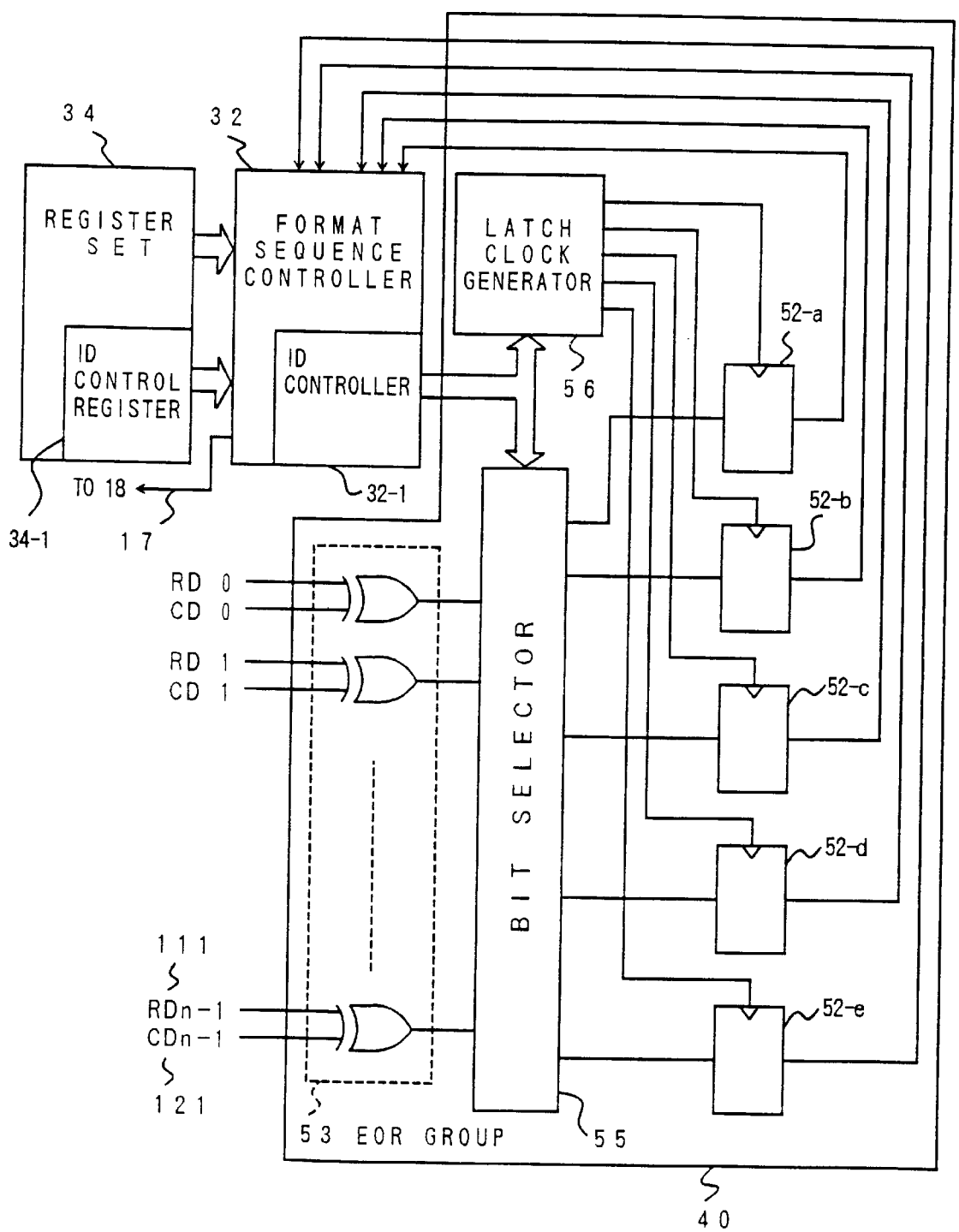
FIG. 5 is a block diagram of a format sequence controller of the disk apparatus and its ID comparators according to the present invention.

As shown in FIG. 5, the ID data comparator 40 includes an EOR group 53 having n exclusive-OR circuits (EOR), a bit selector 55, a latch clock generator 56, a latch 52-$a$ for holding the compared result of a sync and byte sync, a latch 52-$b$ for holding the compared result of cylinder addresses, a latch 52-$c$ for holding the compared result of head addresses, a latch 52-$d$ for holding the compared result of selector addresses, and a latch 52-$e$ for holding the compared result of flags.

In the ID data comparator 40 according to the present invention, the bit selector and five latches for holding the compared results are prepared as shown in FIG. 5. Therefore, the address of each of a cylinder, head and sector and the data of a flag can be set to an arbitrary number of bits, and the compared result can be known for each of these data.

The controller 32 controls a series of sequence operations such as read/write of data and a disk formatting. A transition condition of the sequence is set to the register set 34. A pattern to be written into the recording medium 20 and a pattern to be compared with data read out from it are set to the pattern register 36.

To definitely explain the drive interface controller 24, there will be given the operation at the time of write of ID data and search of the ID data with reference to the sector format shown in FIG. 6, and also with reference to FIGS. 7, 8 and 9. To accomplish the sector format shown in FIG. 6, the ID control register 34-1 is disposed in the register set 34 in this embodiment. Also, the ID pattern register portion is disposed in the pattern register 36. Table 1 shows the set values of the registers.

TABLE 1

Set example of register portion

| | register name | content | set value |
|---|---|---|---|
| ID pattern register | IDR 0 | set cylinder address | $00_H$ |
| | IDR 1 | | $00_H$ |
| | IDR 2 | set head address | $01_H$ |
| | IDR 3 | set sector address | $01_H$ |

TABLE 1-continued

Set example of register portion

| | register name | content | set value |
|---|---|---|---|
| | IDR 4 | | $02_H$ |
| | IDR 5 | set flag data of current sector | $00_H$ |
| | IDR 6 | set flag data of previous sector | $10_H$ |
| ID control register | IDL | set length of ID region | $06_H$ |
| | NCMP | set un-compared region | $06_H$ |
| | RTYSETR | set for each factor that sequence is to be stopped or re-trial is to be made, when prosink and byte sink are not detected, or when result of comparison proves non-coincident [re-trial at high] | $E6_H$ |

| bit | name | factor | set value |
|---|---|---|---|
| bit 0 | RTY 0 | at the time of non-detection of prosink | 1 |
| bit 1 | RTY 1 | at the time of non-detection of byte sink | 1 |
| bit 2 | RTY 2 | when CRC error occurs | 1 |
| bit 3 | RTY 3 | when cylinder addresses are non-coincident | 0 |
| bit 4 | RTY 4 | when head addresses are non-coincident | 0 |
| bit 5 | RTY 5 | when sector addresses are non-coincident | 1 |
| bit 6 | RTY 6 | when flags are non-coincident | 1 |
| bit 7 | | reserved | 0 |

The ID data in this case includes 2 bytes for a cylinder address, 1 byte for a head address, 2 bytes for a selector address and 2 bytes for a flag data. The second byte of the flag data is the flag data of the previous sector. When the ID data is retrieved, the flag data of the current sector is not compared with the read data. When the cylinder address and the head address are non-coincident with the set values of RTYSETR shown in Table 1, the sequence is stopped. The value of each register inside the disk controller 6, inclusive of these registers, is set by the microprocessor 8. A user can change the content of the registers through the host computer 2. In this case, the host computer 2 transfers the content to be changed to the microprocessor 8, and the microprocessor 8 re-writes the content in the registers.

Figure 7:
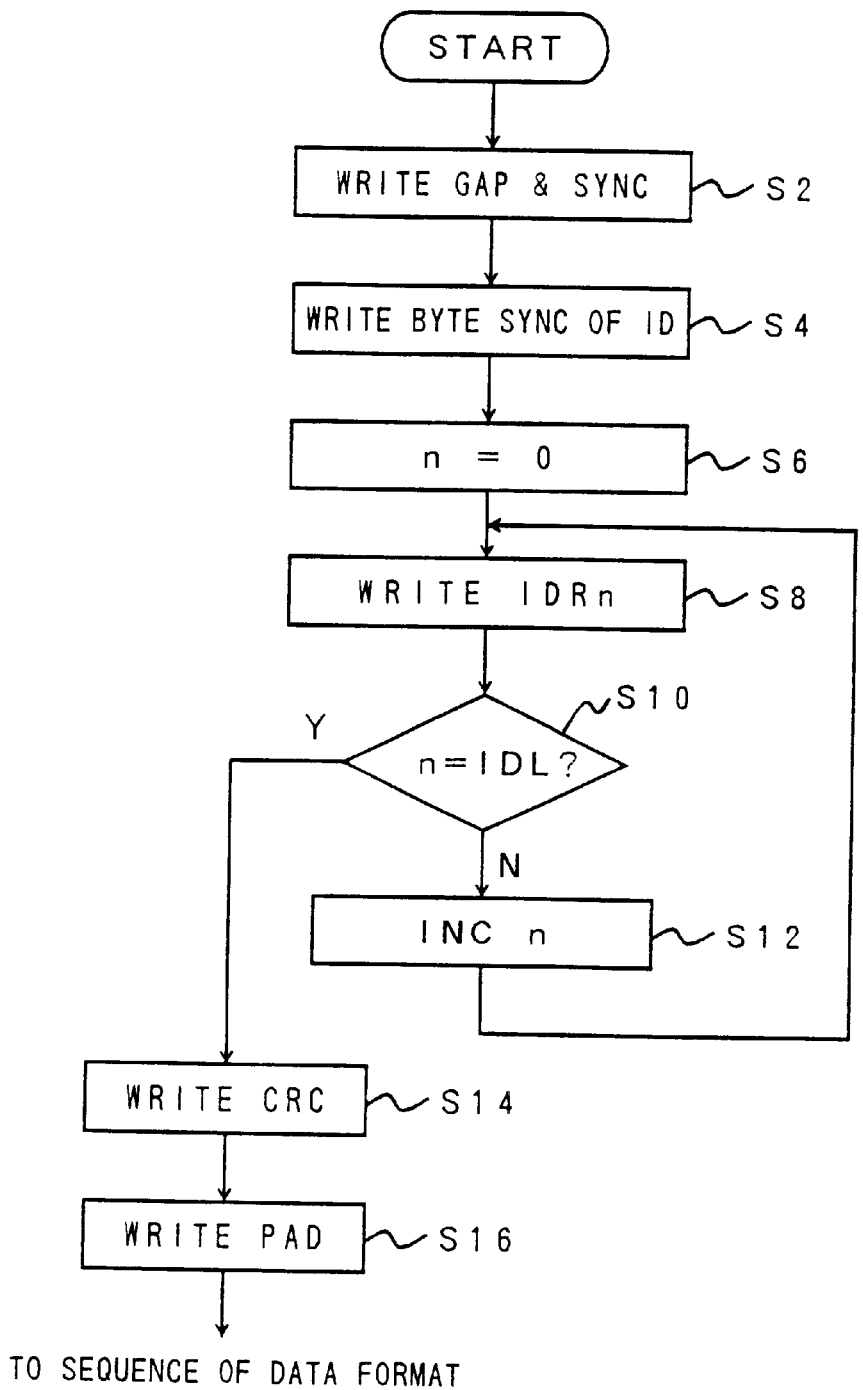
FIG. 7 is an explanatory view of a sequence for writing ID data of the disk apparatus according to the present invention.

(1) When Writing ID Data:

FIG. 7 shows the sequence at the time of writing of the ID data. Each ID data is set to the pattern register 36, but it may be set to the data buffer 10, as well. Even if the ID data is set in any one of them, it can be transferred to the convertor 12 by switching the MPX 38B shown in FIG. 4. At this time, the ID data is also transferred to the ECC 30, so that the CRC code is generated and transferred to the convertor 12 in succession to the ID data.

It should be noted that although the ECC 30 generates the CRC code for the ID data in the embodiment, it may generate a ECC code.

Since FIG. 7 shows the operation flow at the time of write of the ID data, the explanation will be given with reference to FIGS. 4, 5 and 6. [The circuit portion shown in FIG. 5 operates during the comparison of the ID data (during retrieval of the ID data) but does not operate at the time of write of the ID data.]

Figure 6:
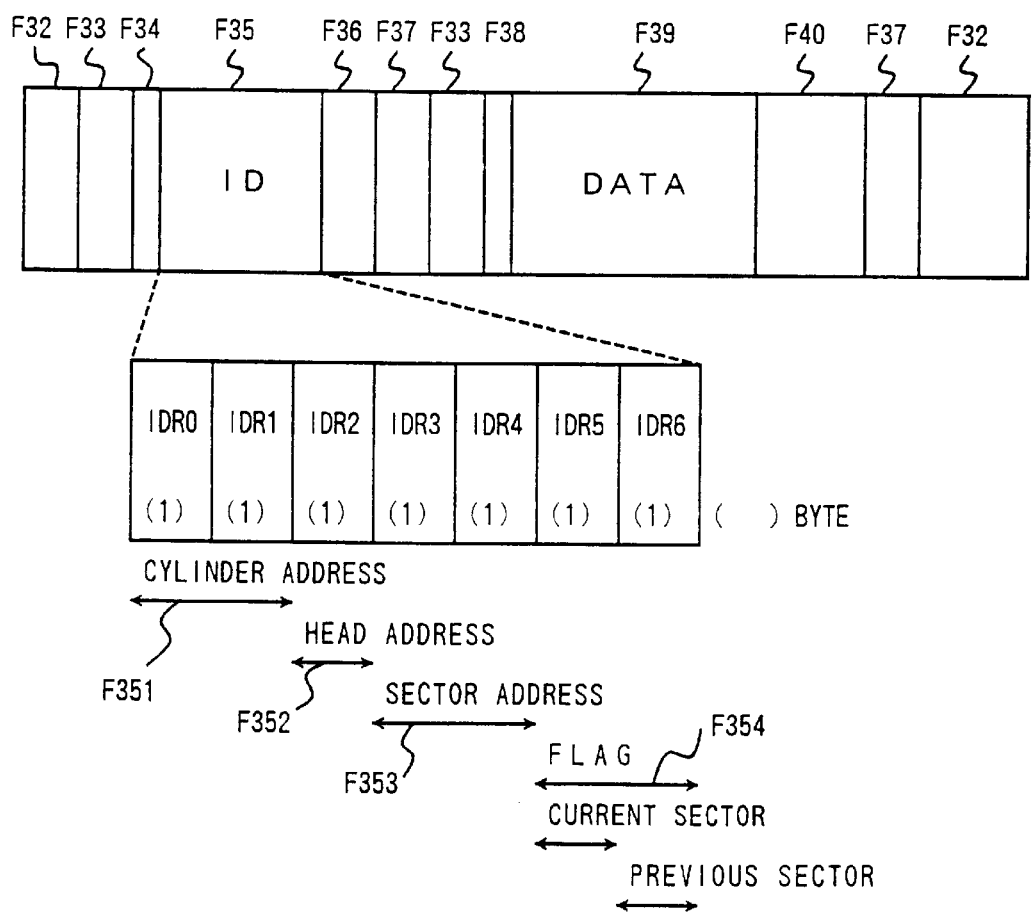
FIG. 6 is an explanatory view showing an example of sector formats used in the disk apparatus according to the present invention.

① In order to format the recording medium 20, as shown in FIG. 6, it is necessary that each pattern of the gap F32, sync F33, byte sync of ID data F34, ID data F35 and pad F37 be set in the register in advance and be sent to the recording medium 20 in a predetermined length and a predetermined sequence.

② Each pattern is in advance set in the pattern register 36 shown in FIG. 4. The MPXs 38A, 38B, 38C, 38D and the output latch 43 are activated by the control signals outputted from the format sequence controller 32 and each pattern is sent to the recording medium 20 in the predetermined length and the predetermined sequence.

③ In the step S2 of "write gap and sync" shown in FIG. 7, the output of a register (any of PRA, PRB, . . . , PRM) storing the pattern of the gap F32 is selected and sent to the convertor 12 through the output latch 43 for a designated byte number. Thereafter, a register storing the pattern of the sync F33 is selected and similarly sent to the convertor 12.

④ The procedures of "write byte sync of ID" (step S4), "write IDRn" (step S6) and "write pad" (step S16) are the same as described in ③. However, the loop portion S8 to S12 of "write IDRn" is accomplished by the controller 32 based on IDL (see Table 1) in the register set 34.

⑤ In "write CRC" (step S14), ID is supplied to the ECC 30 through MPXs 38A, 38B, 38C and the error detection code CRC F36 for the ID F35 is generated by the ECC 30 and is sent to the convertor 12 through the selector 38D in the same way as the step S2.

Figure 8:
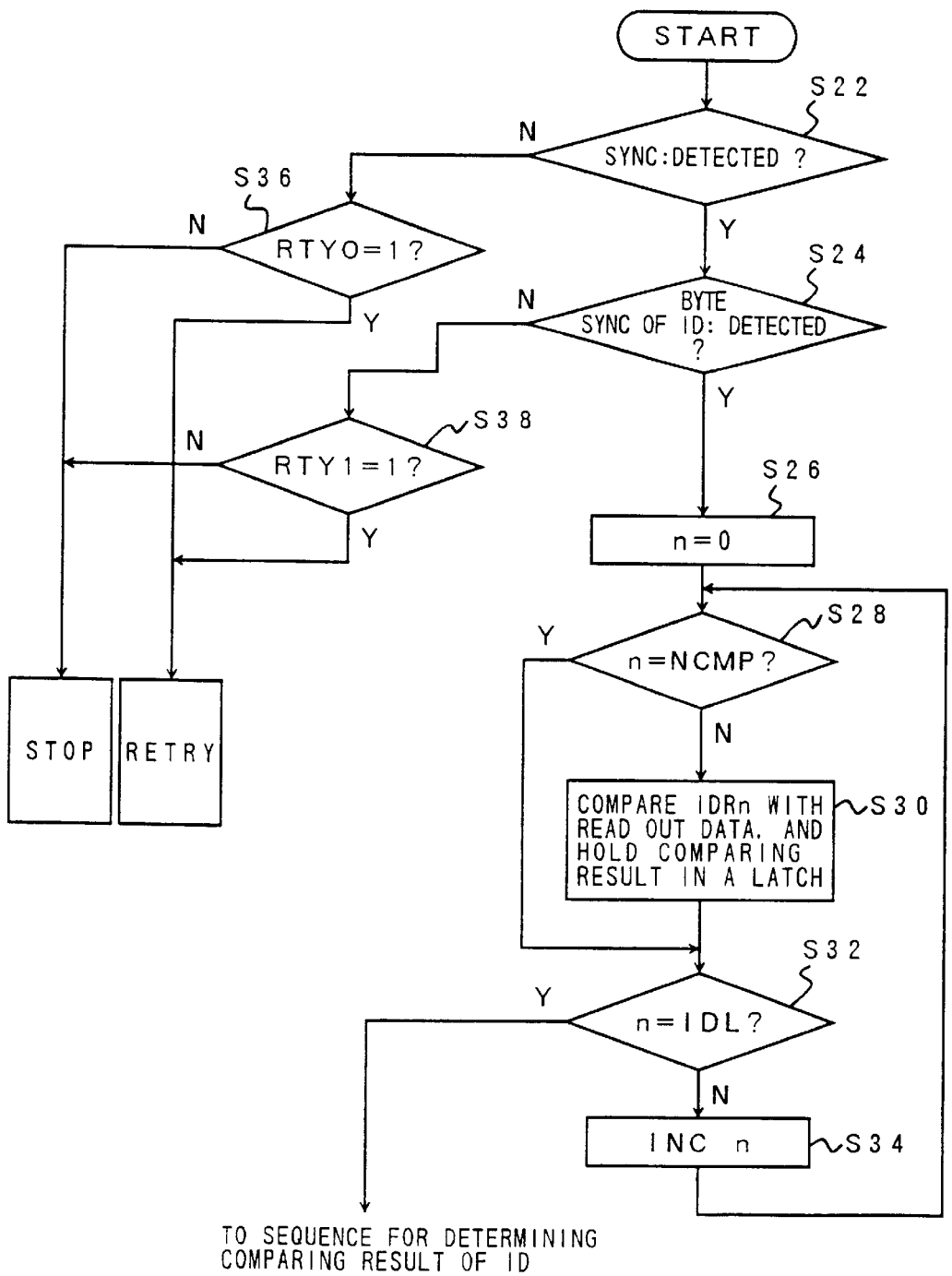
FIG. 8 is an explanatory view of a sequence for latching the comparison result of ID data in the disk apparatus according to the present invention.
Figure 9:
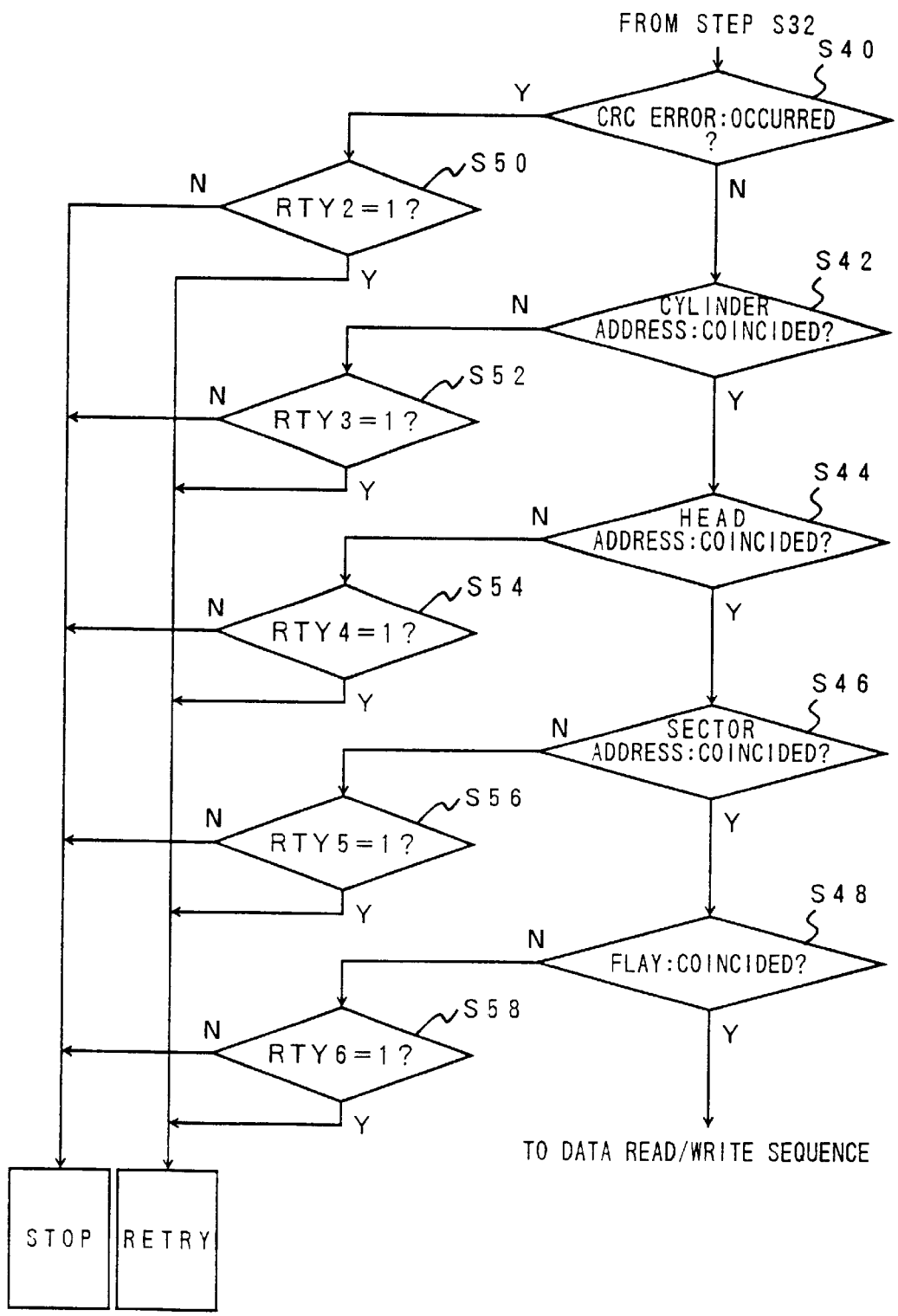
FIG. 9 is an explanatory view of a sequence for judging the comparison result of ID data in the disk apparatus according to the present invention.

(2) When Retrieving ID:

FIGS. 8 and 9 show the sequence for retrieving the ID data. FIG. 8 shows a sequence for latching the compared result of IDs. The ID data read out and the ID stored in the pattern register 36 are compared. Each compared result is latched by the latch 52-*b* for the cylinder address, the latch 52-*c* for the head address, the latch 52-*d* for the selector address and the latch 52-*e* for the flag, as shown in FIG. 5. In this case, the second byte of the flag data has the content corresponding to the flag data of the previous sector. Therefore, the compared result for this byte is not latched. In this sequence, when the sync or byte sync pattern of the ID data cannot be detected, the sequence shifts to the re-trial sequence in accordance with the set values of RTYSETR shown in Table 1.

The operation flow of FIG. 8 will be explained with reference to FIGS. 4, 5 and 6.

⑥ "sync detected?" (step S22):

The sync F33 is detected. The read data RD from the recording medium 20 is applied to the ID data comparator 40 through the input latch 44. The output of a register (any of PRA, PRB, . . . , PRM) storing a pattern of the sync F33 is sent in advance to the ID data comparator 40 through MPX 38A, 38B. Whether or not a pattern of the read data coincides with the sync pattern F33 is judged by the EOR group 53 and the bit selector 55 shown in FIG. 5. Since this comparison is effected in the byte unit in this embodiment, n=7 in FIG. 5. Since each ID data is set in a byte unit as shown in FIG. 6, all the judgements shown in FIG. 8 are made by the comparison in the byte unit, and the bit selector 55 makes the comparison results of all the bits (0 to 7) effective. The comparison results are latched by the corresponding latches. If coincidence is established in the designated byte length, the flow advances to the sequence "Y" and if not, to the sequence "N".

⑦ "byte sync of ID data detected?" (step S24):

The byte sync F34 of the ID data is detected, and the operation is the same as that in ⑥.

⑧ "RTY0=1?" (step S36) & "RTY1=1?" (step S38):

When each of the sync F33 and the ID byte sync F34 is not detected, the comparison operation of the ID data is stopped in accordance with the set values of RTYSETR inside the ID control register 34-1 shown in Table 1 (RTY0= 1, RTY1=1 in this embodiment), or re-trial is selected. In this embodiment, re-trial is made in both cases because RTY0=1 and when RTY1=1.

⑨ Step S30:

IDR0, IDR1, . . . , IDR6, inside the pattern register 36 are sequentially selected, and compared with the read data RD by the comparator 40. At this time, the comparison result of the cylinder address (comparison between IDR0, IDR1 and the read data RD) is latched by the latch 52-$b$. Therefore, the generator 56 supplies the clock to the latch 52-$b$ in response to a control signal from the ID controller 32-1. Subsequently, the similar operations are carried out for the head address, the selector address and the flag data ⑩ "n=NCMP?" (step S28):

The procedure for the regions for which comparison is not made are taken. As shown in Table 1, the regions for which comparison is not made are set in advance into NCMP inside the ID control register 34-1 (IDR6 in this embodiment), so that the compared result of such a region is not held. Furthermore, the judgement of the compared results is carried out in the sequence of "CRC error occurred?" (step S40), "cylinder address coincided ?" (step S42), "head address coincided?" (step S44), "selector address coincided?" (step S46) and "flag coincided?" (step S48). When each of the read ID coincides with each of IDR F351 to F354 and when the CRC error does not occur, the flow shifts to the read/write sequence of the DATA F39. When any of the compared results with respect to the cylinder address and the head address is not coincident in accordance with the set values of RTYSETR, the sequence is stopped through the steps S52 and S54, and a notice indicating that any abnormality occurs in the head positioning controller 18 or in the head selector is given to the microprocessor 8 as well as the controller 18 and selector through the signal line 17. When other compared results are not coincident, the flow shifts to the sequence of re-trial through steps S50, S56 and S58.

When the error is detected in the ECC 30 at the time of read of the ID data, the detected result is sent to the format sequence controller 32. The CRC computation is ordinarily executed for the ID data and its result is used at the time of judgement of the comparison result of the ID data as shown in FIG. 9.

In the embodiment described above, the length of the memory region of each of the cylinder address data, the head address data, the sector address data and the flag data is set in the byte unit. However, the present invention is not particularly limited thereto. Next, an example where the length of the memory region of each of the cylinder address data, the head address data, the sector address data and the flag data is set in the bit unit will be explained.

Assuming that the specification of a compact magnetic disk apparatus as typically represented by 3.5 in. disk stipulates that the "cylinder number: 1,000, head number: 14, sector number per track: 50", regions of "cylinder address data: 10 bits (countable up to 1,024), head address data: 4 bits (countable up to 16), sector address data: 6 bits (countable up to 64); are necessary for each ID data. Assuming that a 4-bit region is necessary for the flag data, the ID region becomes 10+4+6+4=24 bits, that is, 3 bytes. this is shown in FIG. 10. In other words, the following data are set to the ID pattern register 36. The upper 8 bits of a cylinder address are set in IDR0, and the lower 2 bits of the cylinder address, 4 bits of the head address and the upper 2 bits of the sector address are set in IDR1. The lower 4 bits of the sector address and 4 bits of the flag are set to the IDR2.

The embodiment described above considers only the case where the length of the memory region of each of the cylinder address data, the head address data, the sector address data and the flag data is set in the byte unit. Therefore, the IDL is of 1 byte and only the number of bytes is set. To facilitate setting in the bit unit, however, the IDL is set in the following way.

Two bytes must be prepared for the IDL (for designating ID data Length) inside the ID control register 34-1, and the set values become such as shown in FIG. 11. As a result, data is set at IDL1=A9(H), IDL0=A0(H).

Next, the operation at the time of comparison will be explained with reference to FIGS. 5 and 10.

(1) Comparison of First Byte:

The content of IDR0 and the read data are compared, and the bit selector 55 reflects all the compared results for 8 bits onto the cylinder address latch 52-$b$.

(2) Comparison of Second Byte:

The content of IDR1 and the read data are compared. Here, the uppermost 2 bits are used for the comparison of the cylinder address, the subsequent 4 bits for the head address and the next two bits for the selector address. Therefore, the respective compared results (the comparison results for the 2 bits, 4 bits and 2 bits from the uppermost bit) are reflected on the corresponding latches.

(3) Comparison of Third Byte:

The content of IDR2 and the read data are compared, and the upper 4 bits are reflected on the compared result of the selector address and the lower 4 bits on the compared result of the flag in the same way as in (2).

Incidentally, ID controller 32-1 generates the data representing which bits are to be selected and on which latch the compared result is to be reflected upon the comparison of the second and third bytes, based on the contents of the IDL1 and IDL0, and this data is sent to the bit selector 55.

According to the present invention, the length of each memory region of the cylinder address data, the head address data, the selector address data and the flag data can be set in the bit or byte unit. Accordingly, an optimum ID configuration for the characterizing features of the recording medium can be accomplished.

When the read ID data and the requested ID data are compared, the cylinder address data, the head address data, the sector address data and the flag data are individually compared, and the compared results are individually held. Whether or not each of these compared results is used for the ID data coincidence judgement condition is selected, and the portion(s) for which comparison is not made can be set in the bit or byte unit. In this way, the ID data can be enriched. For example, besides the flag data of the current sector, the ID data inclusive of the flag data of the previous or subsequent sector, or the flag data of-both of the previous and subsequent sectors, for example, may be written into the flag data storage region. Thus, when the flag data of the current sector becomes unreadable, the flag data of the current sector can be detected by recognizing the flag data of the previous or subsequent sector or the flag data of both of the previous and subsequent sectors.

If the ID data for the previous sector, the following sector or both the sectors is written in addition to the flag data for the current sector, the ID data for the current sector can be detected in the same manner as described above even if the current sector ID data cannot be read out.

When the compared result proves non-coincident, whether the intended ID retrieval operation is stopped or tried once again can be set for each of the compared results, so that the retrieval operation having high freedom can be accomplished. When the compared result for the cylinder address data or for the head address data provides non-coincident, for example, the ID retrieval operation is stopped and any abnormality of the magnetic head positioning controller or the magnetic head selector can be detected.

As described above, the present invention can provide a magnetic disk control apparatus capable of varying the memory region of the ID data in a bit unit, to thereby enhance ID data retrieval function.

Next, the error detection/correction processing of the transfer data will be explained.

Figure 12:
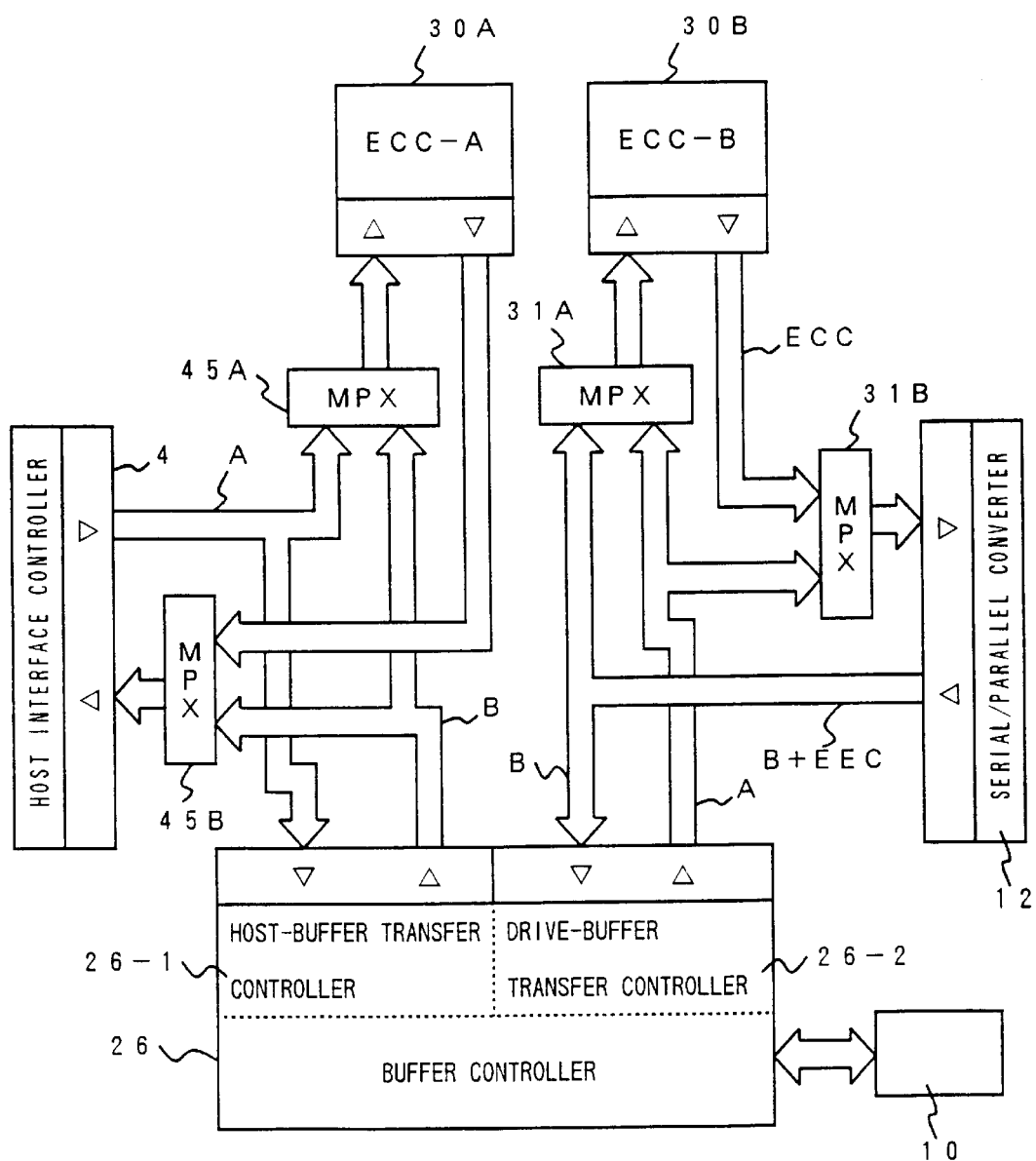
FIG. 12 is a block diagram showing an embodiment of a disk controller in the disk apparatus according to the present invention.

FIG. 12 is a block diagram showing a modified example of the drive interface controller 24 of the disk control apparatus according to the present invention. Reference numerals 30A and 30B represent ECC-A and ECC-B, respectively, and reference numerals 45A and 45B represent multiplexers, respectively. The circuit portions corresponding to those of FIG. 3 are represented by similar reference numerals.

In FIG. 12, the ECC-A 30A and the MPXs 45A, 45B are interposed between the host interface controller 4 and the buffer controller 26, and the rest of the construction are the same as those of the conventional disk control apparatus shown in FIG. 3. The ECC-A 30A executes processings for the generation of check symbols, the error detection and the error correction during the data transfer between the host computer 2 and the data buffer 10. The ECC-B 30B corresponds to the ECC 30 shown in FIG. 3, and executes processings for the error detection and the error correction during the data transfer between the recording medium 20 and the data buffer 10. These processings are entirely independent, and for this reason, these two kinds of data transfer can be made simultaneously and independently. For this reason, data reliability of the entire system can be improved.

Hereinafter, the data write operation from the host computer 2 to the recording medium 20 and the data read operation from the recording medium 20 to the host computer 2 in this embodiment will be explained.

(1) Data Write Operation:

Among data with check symbols transferred from the host computer 2, the data A is transferred, by the buffer transfer controller 26-1, to the data buffer 10 through the host interface controller 4 and is written therein. At the same time, the data with the check symbols is also transferred to the ECC-A 30A through the MPX 45A. Here, the check symbols added to the data A are generated by the host computer 2 subsequent to the data A in accordance with the same primitive polynominal equation and generation polynominal equation as the ECC-A 30A. The ECC-A 30A detects any error for the data A from the data A and these check symbols. When the error is detected, the correction pattern and the correction position can be computed, and the error of the data A inside the data buffer 10 can be corrected.

The data A stored in the data buffer 10 is read out by the drive-buffer transfer controller 26-2 and is transferred to the convertor 12 through the MPX 31B in the same way as in the disk control apparatus shown in FIG. 3. At the same time, the data A is also transferred to the ECC-B 30B through the MPX 31A, where the check symbols for the data A are generated and transferred to the converter 12 through the MPX 31B. Accordingly, the check symbols for the data A are added to the data A and recorded on the recording medium 22 in the same way as in the disk control apparatus shown in FIG. 3.

(2) Data Read Operation:

The data B reproduced from the recording medium 20, to which the check symbols are added is processed by the recording/reproducing circuit 14 in the same way as in the disk control apparatus shown in FIG. 3 and is transferred to the convertor 12. Only the data B is stored in the data buffer 10 by the transfer controller 26-2. The data B and the check symbols are transferred to the ECC-B 30B through the MPX 31A, and the error detection operation for the data B is effected. If any error exists in the data B, the error of the data B inside the data buffer can be corrected in the same way as described above.

The data B inside the data buffer 10 is read out by the transfer controller 26-1 and is transferred to the interface controller 4 through the MPX 45B. The data B read out from the data buffer 10 is transferred to the ECC-A 30A through the MPX 45A, where the check symbols for this data B are generated. These check symbols are transferred to the interface controller 4 through the MPX 45B. Therefore, the check symbols are added to the data B and then transferred to the host computer 2 from the interface controller 4. The host computer 2 performs error detection/correction processing for the data B.

As described above, the error detection/correction and the generation of the check symbols are possible during the data transfer between the host computer 2 and the data buffer 10. The data buffer 10 can be used as a cache memory. In other words, at the time of recording of the data A to the recording medium 20, when the frequency of use of this data A is high the data A is stored in the recording medium 20 and stored in the data buffer 10 as described above so that the data A can be directly read from the host computer 2, whenever necessary. Also, the data B, which has a high frequency of use among the data recorded on the recording medium 20, is once reproduced and stored in the data buffer 10 so that the data can be read out from the data buffer 10 whenever the host computer 2 requires it. In such a case, too, the check symbols generated by the ECC-A 30A using this data B can be added to the data B transferred to the host computer 2.

Figure 13:
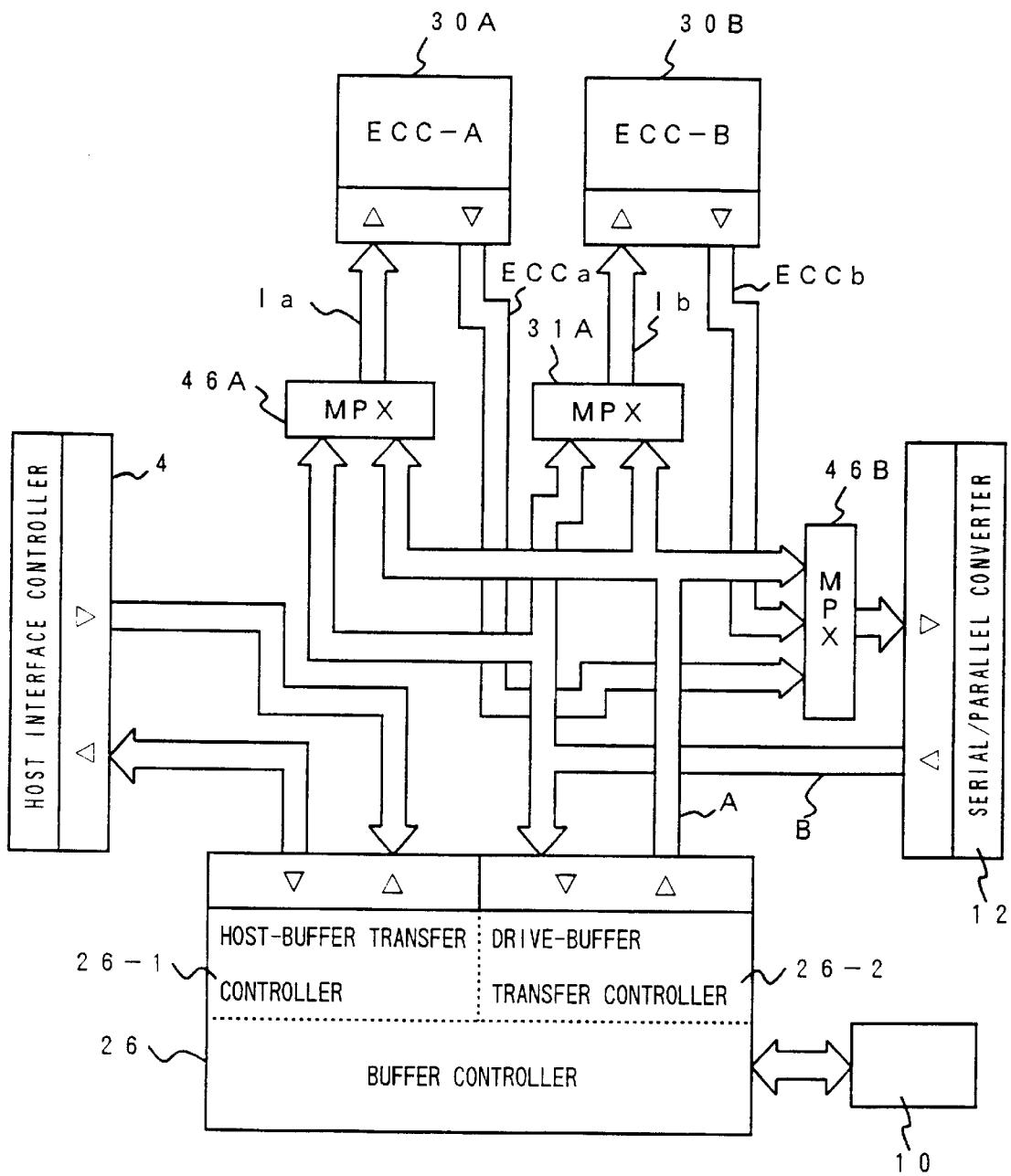
FIG. 13 is a block diagram showing another modified example of the disk controller.

FIG. 13 is a block diagram showing another modified embodiment of the disk control apparatus 6 according to the present invention. Reference numerals 46A and 46B represent the multiplexers MPXs, and like reference numerals are used to identify like constituents as in FIG. 12. In this embodiment, the processing operation of each of the generation of the check symbols, the error detection and the error correction for the data transfer between the recording medium 20 and the data buffer 10 is carried out double using the ECC-A 30A and ECC-B 30B. In this case, the primitive polynominal equation and the generation polynominal equation of the ECC-A 30A may be the same as, or different from, those of the ECC-B 30B. By the way, the error detection/correction operation is not carried out for the data transfer between the host interface controller 4 and the data buffer 10.

Hereinafter, the data write operation from the host computer 2 to the recording medium 20 and the data read operation from the recording medium 20 to the host computer 2 will be explained.

(1) Data Write Operation:

The data A transferred from the host computer 2 is transferred and written into the data buffer 10 by the transfer controller 26-1 through the interface controller 4. Unlike the example shown in FIG. 12, however, the error detection/correction of this data A is not effected. The data A stored in the data buffer is read out by the transfer controller 26-2 and is transferred to the convertor 12. This data A is transferred to the ECC-A 30A through the MPX 46A and to the ECC-B 30B through the MPX 31A, respectively. The check symbols (ECCa) and (ECCb) for the data A are generated by the ECC-A 30A and ECC-B 30B, respectively.

FIGS. 14A to 14D show examples of the input data as the object of computation in the ECC-A 30A and ECC-B 30B.

There are the following cases 1 to 3 for the data A shown in FIG. 14A.

① The case where the output data A from the data buffer 10 is used as the input data Ia to the ECC-A 30A and the input data Ib to the ECC-B 30B, as shown in FIG. 14B;

② The case where the data A is divided into the former and latter halves, the former is used as the input data Ia to the ECC-A 30A and the latter, as the input data Ib to the ECC-B 30B (or vice versa), as shown in FIG. 14C; and ③ The case where the data A is divided into blocks in the unit of one byte or a plurality of bytes, every other block is used as the input data Ia to the ECC-A 30A and every another block, as the input data Ib to the ECC-B 30B, as shown in FIG. 14D.

The input data to the ECC-A 30A and ECC-B 30B may be any of the input data described above. In the case of FIG. 14B, however, a burst error occurring in the check symbols themselves can be relieved, and in the case of FIG. 14C, redundancy for the data A can be expanded. In the case of FIG. 14D, further, the burst error occurring in the data A itself can be relieved. In this way, the check symbols ECCa, ECCb generated by the ECC-A 30A and ECC-B 30B are also transferred to the convertor 12 through the MPX 46B and are added to the data A. The subsequent processings are the same as those of FIG. 12.

(2) Data Read Operation:

The data B which is reproduced from the recording medium 20 and to which the check symbols ECCa, ECCb are added is processed in the way described already, and is transferred to the converter 12. Only the data B is then stored in the data buffer 10 by the transfer controller 26-2. The data B and the check symbols ECCa transferred to the converter 12 are transferred to the ECC-A 30A through the MPX 46A while the data B and the check symbols ECCb transferred to the converter 12 are transferred to the ECC-B 30B, respectively, and each error detection operation is carried out, so that the input data as the object of computation of the ECC-A 30A and ECC-B 30B is the same s the object at the time of writing. If any error is etected in either one, or both, of the ECC-A 30A and ECC-B 30B, the error of the data B inside the data buffer 10 can be corrected as described previously. In the case of the input data Ia, Ib shown in FIG. 14B, for example, if the error is detected only in one of the ECC-A 30A and ECC-B 30B, it means that the error occurs only in one of the check symbols ECCa and ECCb. Accordingly, the data B is as such transferred to the host computer 2 on the basis of the judgement that the error does not occur in the data B. When the error is detected in both of ECC-A 30A and ECC-B 30B, there is the possibility that the error occurs in the data B. Accordingly, error correction of the data B is effected on the basis of the detection result in the ECC-A 30A and ECC-B 30B. In this case, even when the burst error exists in the check symbols ECCa and error correction of the data B in the ECC-A 30A is not possible, for example, this data B can be corrected by the use of the ECC-B 30B.

The data B in the data buffer 10 is read out by the transfer controller 26-1 and is transferred to the host computer 2 through the interface controller 4.

Figure 15:
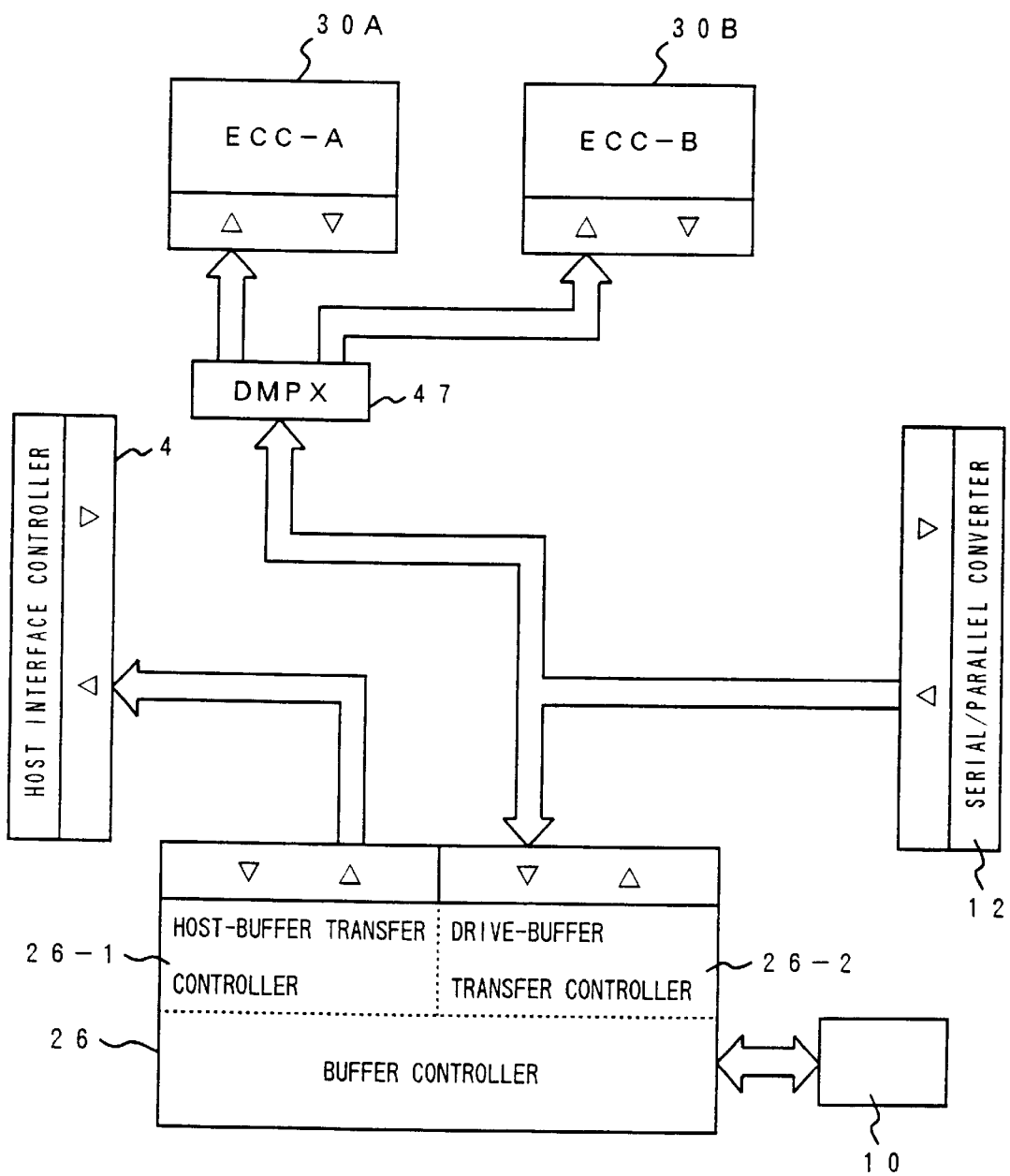
FIG. 15 is a block diagram showing another modified example of the disk controller according to the present invention.

FIG. 15 is a block diagram showing still another modified embodiment of the disk control apparatus 6 according to the present invention. Reference numeral 47 represents a demultiplexer (hereinafter referred to as "DMPX"), and like reference numerals are used to identify like constituents as in FIG. 12. In FIG. 15, the DMPX 47 transfers the input to the converter 12 to either one, or both, of the ECC-A 30A and ECC-B 30B at the time of data reproduction. Though the data bus for the data recording is omitted in this block diagram, it is the same as that shown in FIG. 12. The data and the check symbols added to the data are recorded/reproduced to and from the recording medium 20 in the sector unit. Hereinafter, the combination of the data with the check symbols in the sector unit will be referred to as the "sector data".

When a plurality of sector data having continuous sector addresses are reproduced from such a recording medium 20, these sector data are sequentially transferred to the converter 12 and only the data B among them is sequentially stored by the transfer controller 26-2 in the data buffer 10. At the same time, the sector data are alternately allotted to the ECC-A 30A and ECC-B 30B and are transferred, and the error detection operation is carried out using the data B and its check symbols in each of the ECCs 30A, 30B.

Assuming that the error of the data B is detected in the ECC-A 30A and the error correction is being carried out and that the next sector data is inputted from the converter 12 before the error correction is not yet completed, this sector data is transferred to the ECC-B 30B through the DMPX 47, where the error detection for this sector data is effected. In this way, even when a plurality of sector data are reproduced consecutively, the error is detected in any of the sector data and the error correction operation is subsequently carried out, the error detection can be made by the other ECC. Accordingly, the present invention does not require the stand-by time to wait for one or more rotations of the disk to again reproduce the sector data from the next sector to a sector where the error is detected sector, as has been necessary in the conventional disk control apparatus. For this reason, the reproduced data can be transferred continuously to the host computer 2, and the drop of the data transfer performance due to the error detection/correction operation can be prevented. The operation explained above will be explained in further detail about the case where three sector data are reproduced continuously and the second sector data contains the error, with reference to FIG. 16.

Figure 16:
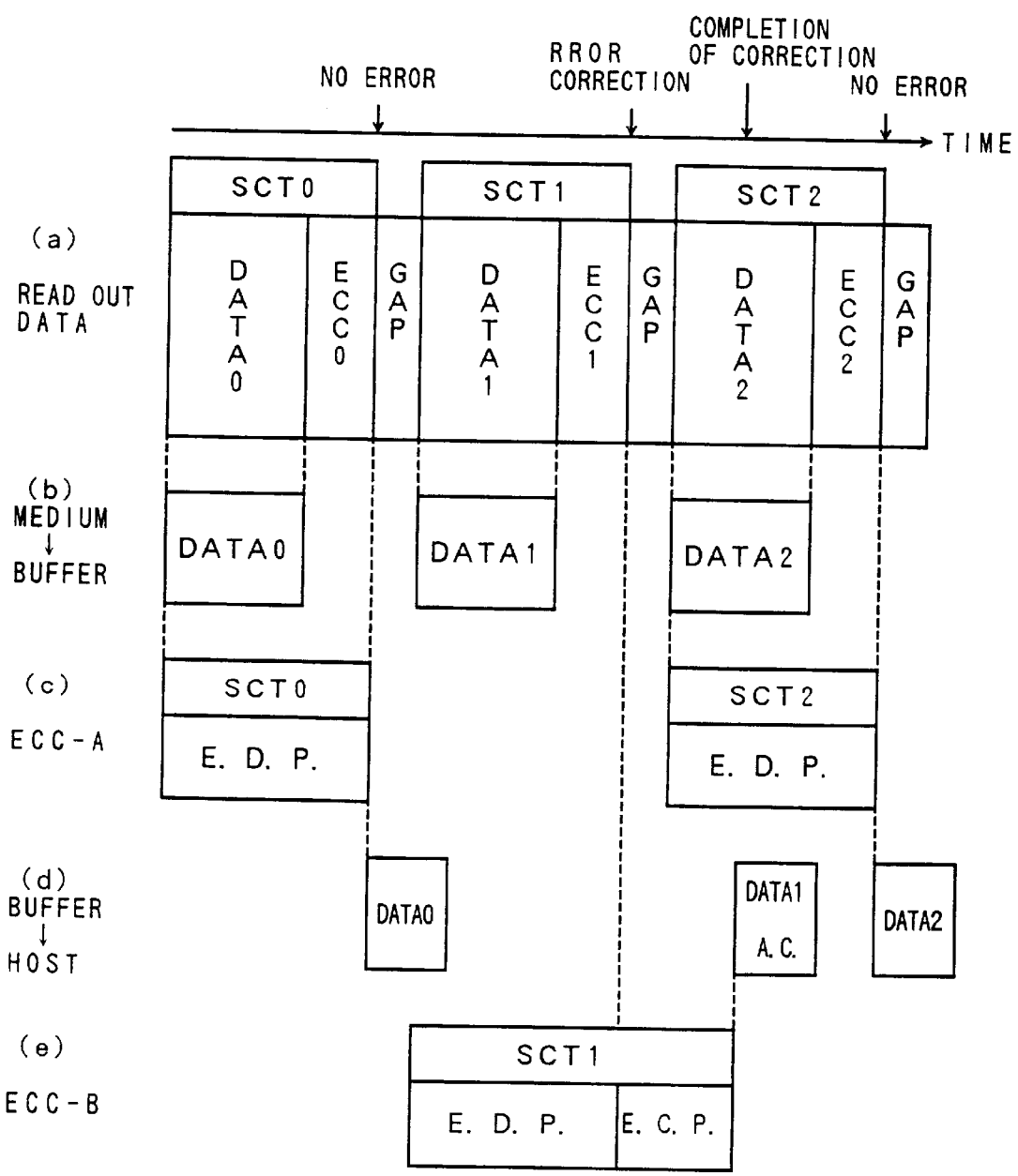
FIG. 16 is a chart showing error detection/correction operations in the embodiment shown in FIG. 15.

In FIG. 16, SCT0, SCT1 and SCT2 represent these three sector data, respectively. The sector data SCT0 includes the data DATA0 and the check symbols ECC0, and a gap GAP is interposed between this check symbol ECC0 and the next sector data SCT1. This also holds true of the sector data STC1 and STC2, and their data and check symbols will be referred to as "DATA 1, 2 and ECC1 and 2", respectively. As shown in FIG. 16(a), the three sector data SCT0, STC1 and STC2 are reproduced in the order named, and are transferred to the converter 12. However, only the DATA0, 1 and 2 are stored in the data buffer 18 as shown in FIG. 16(b). Note that a transfer delay between blocks is neglected in FIG. 16.

On the other hand, the sector data SCT0 is transferred to either one (here, the ECC-A 30A) of the ECC-A 30A and ECC-B 30B through the DMPX 47, and the error detection is carried out as shown in FIG. 16(c). In this case, since the sector data SCT0 does not contain any error. Therefore, when all the check symbols ECC0 are supplied and no error is detected by the ECC-A 30A, the DATA0 stored in the data buffer 10 is read out from the data buffer 10 by the transfer controller 26-1 as shown in FIG. 16(d), and is transferred to the host computer 2 through the interface controller 4. During the transfer of this DATA0 to the host computer 2, the DATA 1 of the sector data SCT1 is stored in the data buffer 10 as shown in FIG. 16(b) and at the same time, as shown in FIG. 16(e), the sector data SCT1 is transferred to the ECC-B 30B through the DMPX 47, so that the error detection is carried out. This DATA 1 contains an error. Accordingly, after all the check symbols ECC1 are supplied, the ECC-B 30B judges that the error exists. Thereafter, the error correction of the data DATA 1 is effected as shown in FIG. 16(d). After this error correction is completed, the data DATA 1 is read out from the data buffer 10 by the transfer controller 26-1 and is transferred to the host computer 2 through the interface controller 4.

During the error correction operation of the data DATA 1 by the ECC-B 30B, the next sector data SCT2 is inputted to the converter 12 as shown in FIG. 16(a). However, since this sector data SCT2 is transferred to the ECC-A 30A through the DMPX 47 as shown in FIG. 16(c), error detection of the data DATA 2 can be made, and no problem is rendered for the error correction operation of the data DATA 1 by the ECC-B 30B.

As described above, in this embodiment, the ECC-A 30A and the ECC-B 30B are alternately used for the error detection/correction operation of all the sector data. However, there could be considered the case where the ECC-B 30B performs normally the error detection operation and corrects an error when the error is detected in sector data and only in such a case the ECC-A 30A performs the error detection operation for the next sector data. Also, as described above, this embodiment can make the sequential error detection and correction operations of the sector data without waiting for the rotation of the disk, and can make error detection and correction of the reproduced data without the drop of data transfer performance.

Figure 17:
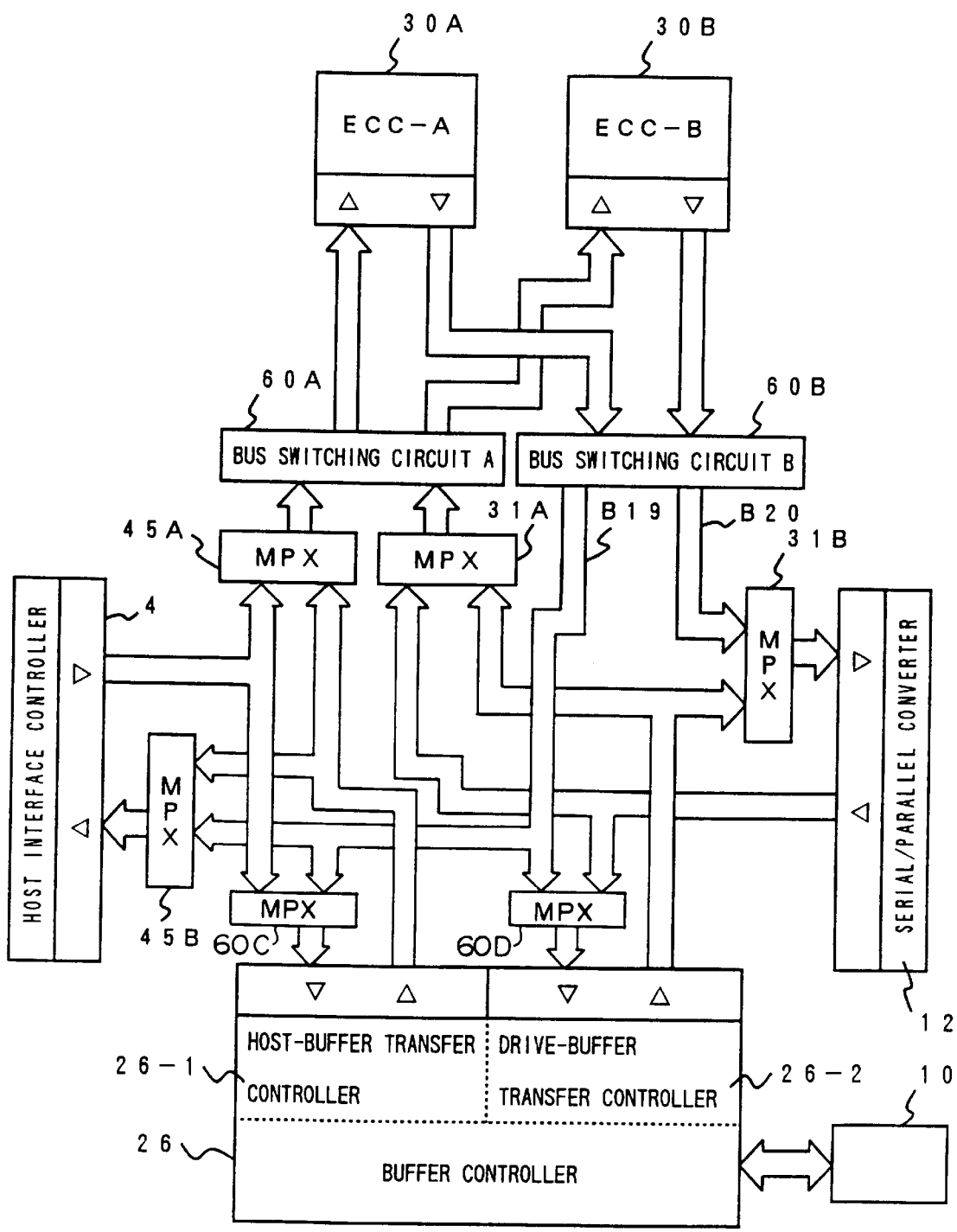
FIG. 17 is a block diagram showing still another modified embodiment of the disk controller according to the present invention.

FIG. 17 is a block diagram showing still another modified embodiment of the disk control apparatus 6 according to the present invention. Reference numerals 60A and 60B represent bus switches, respectively, and like reference numerals will be used to identify like constituents as in FIGS. 12 and 13.

This embodiment can operate in the same way as he foregoing embodiments and facilitates other perations.

In FIG. 17, the bus switch 60A selects either one, or both, of the outputs of the MPX 45A, 31A, and transfers the output(s) to either one, or both, of the ECC-A 30A, ECC-B 30B. The bus switch 60B selects either one, or both, of the outputs of the ECC-A 30A, ECC-B 30B and transfers the output(s) to either one, or both, of the data buses B19, B20.

Here, the case where this embodiment is operated in the same way as in the embodiment shown in FIG. 12 will be explained.

(1) The Case Where Data From Host Computer 2 is Recorded on Recording Medium 20:

When the data is transferred from the interface controller 4 to the data buffer 10, the-bus switch 60A is so controlled as to select only the output of the MPX 45A and to transfer it to the ECC-A 30A. When the data is transferred from the data buffer 10 to the converter 12, the bus switch 60A is so controlled as to select only the output of the MPX 31A and to transfer it to only the ECC-B 30B. At the same time, the bus switch 60B is so controlled as to select only the output of the ECC-B 30B and to transfer it to only the MPX 31B through the data bus B20. Incidentally, even when the data from the interface controller 4, which is outputted from the MPX 45A, and the data from the data buffer 10, which is outputted from the MPX 31A, are simultaneously supplied, there occurs no problem because the bus switch 60A transfers separately the data outputted from the MPX 45A to the ECC-A 30A and the data outputted from the MPX 31A to the ECC-B 30B.

In FIG. 17, the ECC-A 30A performs the error detection operation for data block with a check symbols transferred from the host computer 2. When any error is detected, the ECC-A 30A performs the error correction operation for the error. The ECC-B 30B can perform the error detection operation for the next data block with check symbols consecutively transferred from the host computer 2, without waiting for completion of the error correction operation by the ECC-A 30A. In this case, generation of check symbols during data transfer from the data buffer 10 to the recording medium 20 is stopped temporarily because the ECC-B 30B is in operation. If there are employed more than two ECCs, such a problem can be eliminated.

(2) When the Data is Reproduced From Recording Medium 20 and Transferred to Host Computer 2:

When the data is transferred from the convertor 12 to the data buffer 10, the bus switch 60A is so controlled as to select only the output of the MPX 31A and to transfer it only to the ECC-B 30B. When the data is transferred from the data buffer 10 to the interface controller 4, the bus switch 60A is so controlled as to select only the output of the MPX 45A and to transfer it to only the ECC-A 30A. At the same time, the bus switch 60B is so controlled as to select only the output of the ECC-A 30A and to transfer it to only the MPX 45B through the data bus B19. Even when the data from the data buffer 10 outputted from the MPX 45A and the data from the convertor 12 outputted from the MPX 31A are simultaneously supplied, there occurs no problem because the bus switch 60A transfers separately the data outputted from the MPX 45A to the ECC-A 30A and the data outputted from the MPX 31A to the ECC-B 30B. Such operations are the same as those of the embodiment shown in FIG. 12. In this case, the ECC-A 30A and ECC-B 30B shown in FIG. 17 correspond to the ECC-A 30A and ECC-B 30B shown in FIG. 12, respectively.

The above explains the case where this embodiment is operated in the same way as the embodiment shown in FIG. 12. Therefore, the case where this embodiment is operated in the same way as the embodiment shown in FIG. 13 will now be explained.

First of all, when the data from the host computer 2 is recorded on the recording medium 20, the bus switch 60A is so controlled as to select only the output of the MPX 31A and to simultaneously transfer it to both ECC-A 30A and ECC-B 30B, and the bus switch 60B is so controlled as to sequentially select the outputs of the ECC-A 30A and ECC-B 30B and to transfer them to the MPX 31B through the data bus B20. When the data is reproduced from the recording medium 20 and is transferred to the host computer 2, the bus switch 60A is so controlled as to select only the output of the MPX 31A and to transfer it to both the ECC-A 30A and ECC-B 30B. Such operations are the same as those of the modified embodiment shown in FIG. 13. In this case, the ECC-A 30A and ECC-B 30B in FIG. 17 correspond to the ECC-A 30A and ECC-B 30B shown in FIG. 13, respectively, and the bus switch 60B and the MPX 31B in FIG. 17 correspond to the MPX 46B in FIG. 13.

Next, the case where this embodiment is operated in the same way as the embodiment shown in FIG. 15 will be explained.

When the data is reproduced from the recording medium 20 and is transferred to the host computer 2, the bus switch 60A is so controlled as to select only the output of the MPX 31A and to alternately transfer it to the ECC-A 30A and ECC-B 30B each time the sector data is outputted from the convertor 12. Such an operation is the same as that of the embodiment shown in FIG. 13 and in this case, the ECC-A 30A and ECC-B 30B shown in FIG. 17 correspond to the ECC-A 30A and ECC-B 30B shown in FIG. 15, respectively, and the bus switch 60A shown in FIG. 17 corresponds to the DMPX 47 in FIG. 15.

The above explains the case where the operation is made in the same way as in the foregoing embodiments, but the following operation can be made, as well.

Figure 18:
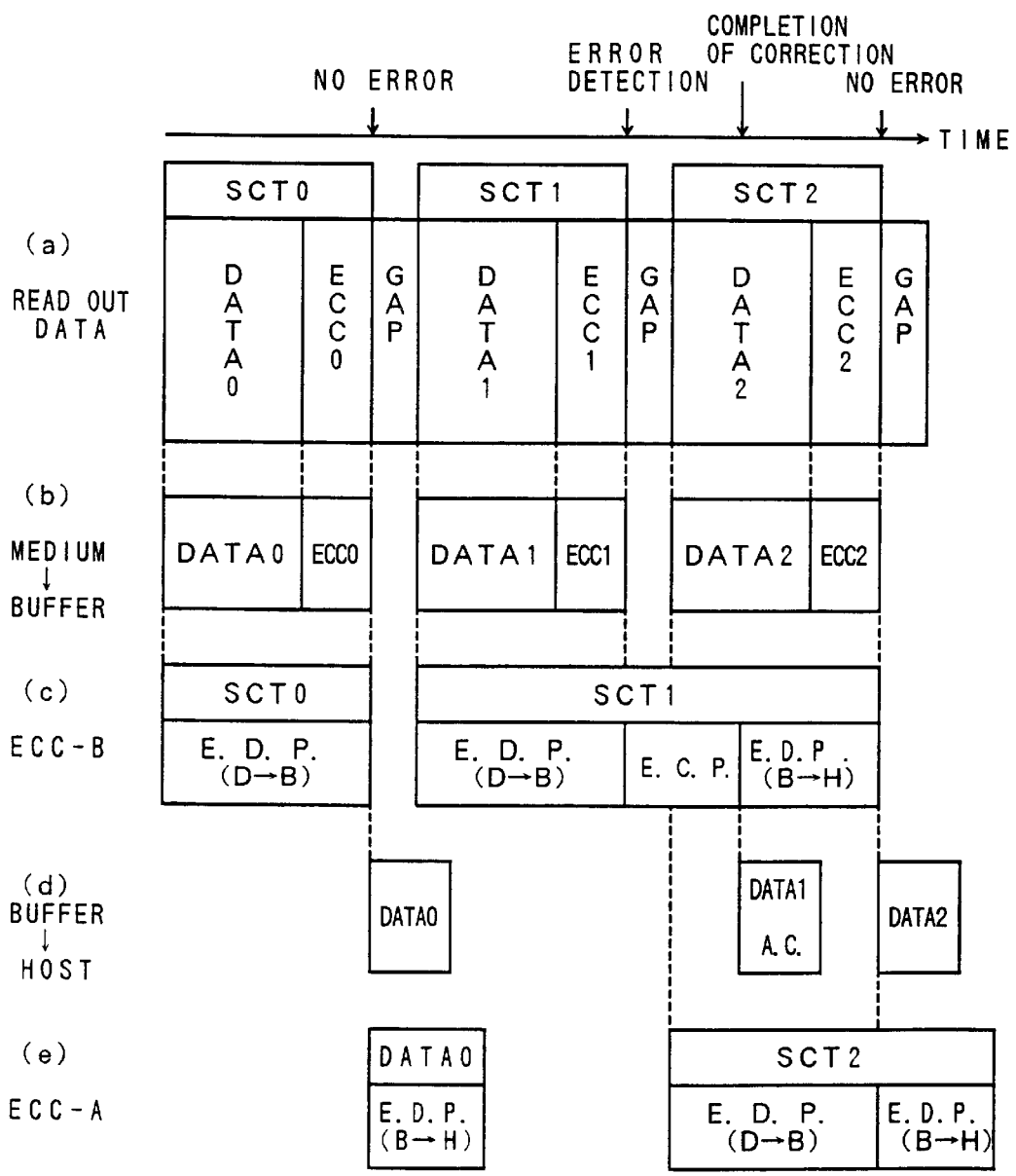
FIG. 18 is a chart showing the error detection/correction operations in the embodiment shown in FIG. 17.

In other words, when the data reproduced from the recording medium 20 is transferred to the host computer 2, the error detection can be made at the time of the data transfer from the convertor 12 to the data buffer 10 and at the time of the data transfer from the data buffer 10 to the host computer 2, by the use of the two ECCs. In this way, reliability of the data transferred to the host computer 2 can be further improved, and even when a plurality of sector data are reproduced continuously in the same way as in the embodiments explained with reference to FIGS. 15 and 16, the data error correction can be made without waiting for the rotation of the recording medium 20. Hereinafter, this operation will be explained with reference to FIG. 18. In FIG. 18, too, three sector data SCT0, SCT1 and SCT2 are reproduced continuously in the same way as in FIG. 16, and an error is assumed to exist in the DATA1 of the sector data SCT1.

In FIG. 17, when the sector data SCT0 is reproduced in FIG. 17, it is outputted from the convertor 12 (FIG. 18(*a*)), and is written into the data buffer 10 by the transfer controller 26-2 while containing the check symbols ECC0 (FIG. 18(*b*)). This sector data SCT0 is also transferred to the ECC-B 30B through the MPX 31A and the bus switch 60A, where the error detection processing is executed (FIG. 18(*c*)). In this case, since the DATA0 does not contain any error, the sector data SCT0 is as such read out from the data buffer 10 by the transfer controller 26-1 and only the data DATA0 is transferred to the host computer 2 through the MPX 45B and the interface controller 4 (FIG. 18(*d*)). At the same time, the sector data SCT0 read out from the data buffer 10 is transferred to the ECC-A 30A through the MPX 45A and the bus switch 60A, and the error detection processing is again executed using the same check symbol ECC0 (FIG. 18(*e*)). When no error is detected at this time, the processing for this sector data SCT0 is completed. When an error is detected, it is informed to the host computer 2, and after the error correction operation is performed, the data is transferred to the host computer 2 again.

The next sector data SCT1 is reproduced from the recording medium 20 during the transfer of the DATA0 from the data buffer 10 to the host computer 2 (FIG. 18(*a*)), and is transferred and written into the data buffer 10 from the convertor 12 in the same way as described above (FIG. 18(*b*)). In this case, since the data DATA1 of the sector data SCT1 contains an error, the ECC-B 30B detects this error and executes the error correction of the DATA1 inside the data buffer 10 (FIG. 18(*c*)). In the interim, the next sector data SCT2 is reproduced from the recording medium 20 (FIG. 18(*a*)), and is outputted from the convertor 12. In this case, the sector data SCT2 is written into the data buffer 10 (FIG. 18(*b*)) and at the same time, is transferred to the ECC-A 30A through the MPX 31A and the bus switch 60A, and when the error detection processing of the data DATA2 is executed (FIG. 18(*e*)). Accordingly, the error detection of the next data can be made without waiting for the rotation of the recording medium 20.

While the ECC-A 30A carries out the error detection processing of the data DATA2 (FIG. 18(*e*)), the ECC-B 30B finishes the error correction processing of the data DATAL (FIG. 18(*c*)) and the sector data SCT1 is read out from the data buffer 10 and is transferred to the host computer 2 through the MPX 45B and the host interface controller 4 (FIG. 18(*d*)). At the same time, the sector data is also transferred once again to the ECC-B 30B through the MPX 45A and the bus switch 60A, and the error detection processing of the data DATA1 is again made using the check symbols ECC1 (FIG. 18(*c*)). At this time, if no error remains in the data DATA1, the processing of the sector data SCT1 is completely finished.

On the other hand, in the ECC-A 30A, any error is not detected for the data DATA2 of the sector data SCT2. Therefore, this sector data SCT2 is read out from the data buffer 10 and is transferred to the host computer 2 as described above, and at the same time, is again transferred to the ECC-A 30A as described above, where the error detection processing of the data DATA2 is again effected. When no error is detected, the processing of this sector data SCT2 is completed. In this way, the error detection processing can be executed consecutively in the transfers between the recording medium 20 and the data buffer 10, and the data buffer 10 and the host computer 2, without waiting for any rotation of the recording medium 20, and reproduced data having high reliability can be obtained.

When a plurality of sector data are reproduced continuously and when they contain no error, the error detection/correction is always carried out in the ECC-B 30B during the data transfer from the convertor 12 to the data buffer 10 while the error detection/correction is carried out in the ECC-A 30A during the data transfer from the data buffer 10 to the host computer 2. Accordingly, when a sector data is further reproduced after the sector data SCT2 in FIG. 18, the error detection/correction processing for this sector data is carried out in the ECC-B 30B during the data transfer from the convertor 12 to the data buffer 10 and in the ECC-A 30A during the data transfer from the data buffer 10 to the host computer 2.

As explained above, the present invention can execute each of the operations of the generation of the check symbols, the error detection and the error correction not only during the data transfer between the recording medium and the data buffer but also during the data transfer between the host computer and the data buffer, and can thus improve data reliability of the system as a whole. Since each of these data transfer is carried out independently and simultaneously, the drop of data transfer performance due to the generation of the check symbols, the error detection and the error correction hardly exists.

The present invention can execute in multiples each of the operations of the generation of the check symbol, the error detection and the error correction for the data transfer between the recording medium and the data buffer using a plurality of ECCs, and can obtain the effects of relief of the burst error occurring in the check symbols itself, expansion of redundancy for the data, relief of the burst error occurring in the data, and so forth, by selecting the input data to each of the ECCs in a suitable form. Accordingly, error detection and error correction performance of the disk control apparatus can be improved, and data reliability of the system can be improved as a whole.

When a plurality of sector data are reproduced continuously, the present invention can execute the error detecting operation for the sector data that are read out continuously, even when any error is detected in any of the sectors and the error correction operation is carried out, without waiting for any rotation of the magnetic medium. Accordingly, the data can be transferred continuously to the host computer, and the drop of data transfer performance due to the error correcting operation can be prevented.

What is claimed is:

1. A method of recording/reproducing data in a recording/reproducing apparatus including a plurality of error detection/correction (ECC) circuits, a plurality of bus switch circuits selecting an input and output of each of said ECC circuits to correct errors in the data to be recorded/reproduced, each of said ECC circuits generating check symbols from data input from said bus switch circuits and including input means for providing said check symbols to said bus switch circuits, and means for detecting and correcting a data error based on said data and said check symbols, said method comprising the steps of:

generating medium recording check symbols from recording data and recording the same to a recording medium in a write mode when said recording data stored in a buffer is recorded to said recording medium, by selectively using said plurality of ECC circuits and data input to said ECC circuits;

transferring reproduction data from said recording medium to a host device through said buffer in the read mode, wherein said bus switch circuits assign each of said ECC circuits to a different circuit path on which a portion of said reproduction data is transferred during a data transfer;

detecting any error of said reproduction data based on medium reproduction check symbols added to said reproduction data during said transfer in the read mode, and correcting said reproduction data stored while subsequent data is being transferred, when the error is detected, thereby selectively using a plurality of said ECC circuits and data input to said ECC circuits;

detecting any error of said recording data based on host recording check symbols added to said recording data stored in the buffer, in the read mode or the write mode, selectively using said plurality of ECC circuits and correcting said recording data while subsequent data is being transferred, when the error is detected; and generating host reproduction check symbols from said reproduction data and sending the host reproduction check symbols to said host during the data transfer from said buffer to said host device in the read mode selectively using said plurality of ECC circuits and data input to said ECC circuits.

2. A data recording/reproducing apparatus comprising:

a plurality of error detection/error correction (ECC) circuits;

a plurality of bus switch circuits each selecting an input and output of each of said ECC circuits to correct an error in transferred data;

wherein each of said ECC circuits generates check symbols from data input from said bus switch circuit, and includes input means for providing said check symbols to said bus switch circuits and means for detecting and correcting a data error based on said data and said check symbols;

means for generating medium recording check symbols from recording data and recording the same to a recording medium in a write mode when said recorded data stored in a buffer is recorded to said recording medium by selectively using said plurality of ECC circuits and data input to said ECC circuits;

means for transferring reproduction data from said recording medium to a host device through said buffer in the read mode, wherein said bus switch circuits assign each of said ECC circuits to a different circuit path on which a portion of said reproduction data is transferred during a data transfer;

means for detecting any error of said reproduction data based on medium reproduction check symbols added to said reproduction data during said transfer in the read mode, and correcting said reproduction data stored while subsequent data is being transferred, when the error is detected, thereby selectively using said plurality of said ECC circuits and data input to said ECC circuits;

means for detecting any error of said recording data based on host recording check symbols added to said recording data stored in a buffer, in the read mode or the write mode, selectively using said plurality of said ECC circuits and correcting said recording data while subsequent data is being transferred, when the error is detected; and means for generating host reproduction check symbols from said reproduction data and sending the same to said host during the data transfer from said buffer to said host device in the read mode selectively using said plurality of said ECC circuits and data input to said ECC circuits.

* * * * *